(12) United States Patent
Yeoh et al.

(10) Patent No.: US 12,557,636 B2
(45) Date of Patent: Feb. 17, 2026

(54) GATE ALL AROUND BACKSIDE POWER RAIL FORMATION WITH BACKSIDE DIELECTRIC ISOLATION SCHEME

(71) Applicant: Applied Materials, Inc., Santa Clara, CA (US)

(72) Inventors: Andrew Yeoh, Portland, OR (US); Benjamin Colombeau, San Jose, CA (US); Balasubramanian Pranatharthiharan, San Jose, CA (US); Ashish Pal, San Ramon, CA (US); El Mehdi Bazizi, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 419 days.

(21) Appl. No.: 18/106,621

(22) Filed: Feb. 7, 2023

(65) Prior Publication Data

US 2023/0260908 A1 Aug. 17, 2023

Related U.S. Application Data

(60) Provisional application No. 63/311,100, filed on Feb. 17, 2022.

(51) Int. Cl.
*H01L 23/528* (2006.01)
*H01L 21/02* (2006.01)
(Continued)

(52) U.S. Cl.
CPC .... *H01L 23/5286* (2013.01); *H01L 21/02532* (2013.01); *H01L 21/02603* (2013.01);
(Continued)

(58) Field of Classification Search
CPC .......... H01L 23/5286; H01L 21/02603; H01L 23/5226; H10D 30/6735
See application file for complete search history.

(56) References Cited

U.S. PATENT DOCUMENTS 9,484,270 B2 11/2016 Hook et al.
9,502,564 B2 11/2016 Moll et al.
(Continued)

FOREIGN PATENT DOCUMENTS

CN 113206062 A 8/2021
WO 2023158690 A1 8/2023

OTHER PUBLICATIONS

"PCT International Search Report and Written Opinion in PCT/US2023/013134 dated Jul. 13, 2023, 10 pages".
(Continued)

*Primary Examiner* — Brian Turner
(74) *Attorney, Agent, or Firm* — SERVILLA WHITNEY LLC

(57) ABSTRACT

Semiconductor devices and methods of manufacturing the same are described. The method includes forming distinct and separate bottom dielectric isolation layers underneath the source/drain and underneath the gate of a gate all around device. Selectively remove of the bottom dielectric isolation layer underneath the source/drain results in better backside power rail (BPR) via alignment to the source/drain epi and reduces reliability and gate-shorting problems.

13 Claims, 23 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC ........... *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/018* (2025.01)

(56) References Cited

U.S. PATENT DOCUMENTS

| | | | |
|---|---|---|---|
| 2014/0065794 A1 | 3/2014 | Kar et al. | |
| 2018/0053690 A1* | 2/2018 | Wang | H10D 84/014 |
| 2020/0303500 A1 | 9/2020 | Loubet et al. | |
| 2020/0357884 A1 | 11/2020 | Xie et al. | |
| 2021/0193817 A1* | 6/2021 | Chen | H01L 21/76897 |
| 2021/0375685 A1 | 12/2021 | Xie et al. | |
| 2021/0408246 A1 | 12/2021 | Ganguly et al. | |
| 2022/0139911 A1* | 5/2022 | Wei | H01L 23/5226 257/365 |
| 2022/0293759 A1* | 9/2022 | Chou | H10D 62/121 |

OTHER PUBLICATIONS

Loubet, N., et al., "Stacked Nanosheet Gate-All-Around Transistor to Enable Scaling Beyond FinFET", 2017 Symposium on VLSI Technology Digest of Technical Papers, 2 pages.

Zhang, J., et al., "Full Bottom Dielectric Isolation to Enable Stacked Nanosheet Transistor for Low Power and High Performance Applications", 2019 IEEE International Electron Devices Meeting (IEDM), 4 pages.

* cited by examiner

GATE ALL AROUND BACKSIDE POWER RAIL FORMATION WITH BACKSIDE DIELECTRIC ISOLATION SCHEME

CROSS-REFERENCE TO RELATED APPLICATIONS

This application claims priority to U.S. Provisional Application No. 63/311,100, filed Feb. 17, 2022, the entire disclosure of which is hereby incorporated by reference herein.

TECHNICAL FIELD

Embodiments of the disclosure generally relate to semiconductor devices. More particularly, embodiments of the disclosure are directed to gate-all-around (GAA) devices including a multi-color dielectric isolation for GAA backside power rail formation.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a gate all around (GAA) structure. The GAA device structure includes several lattice matched channels suspended in a stacked configuration and connected by source/drain regions. The GAA structure provides good electrostatic control and can find broad adoption in complementary metal oxide semiconductor (CMOS) wafer manufacturing.

The presence of a bottom dielectric isolation layer is becoming a major performance enhancing layer for nanosheet devices. Accordingly, there is a need for improved methods for forming gate-all-around devices having a bottom dielectric isolation layer.

SUMMARY

One or more embodiments of the disclosure are directed to methods of forming a semiconductor device. In one or more embodiments, a method of forming a semiconductor device comprises: forming a gate structure on a superlattice structure, the superlattice structure on a sacrificial layer on a substrate, the superlattice structure comprising a plurality of horizontal channel layers and a corresponding plurality of semiconductor material layers alternatingly arranged in a plurality of stacked pairs; forming a plurality of source trenches and a plurality of drain trenches adjacent to the superlattice structure on the substrate; depositing a first bottom dielectric isolation layer in the plurality of source trenches and the plurality of drain trenches; removing the sacrificial layer to form a plurality of openings under the gate structure; depositing a second bottom dielectric isolation layer in the plurality of openings; laterally recessing the plurality of semiconductor material layers to form a recess opening; forming an inner spacer in the recess opening; epitaxially forming a source/drain region; rotating the device; depositing a hardmask material on the substrate; selectively etching the substrate to form a plurality of backside power rail via openings; selectively removing the first bottom dielectric isolation layer; and depositing a metal in the plurality of backside power rail via openings to form a plurality of vias.

One or more embodiments of the disclosure are directed to gate all around devices. In one or more embodiments, a gate all around device comprises: a gate structure on a superlattice structure, the superlattice structure on alternating layers of a first bottom dielectric isolation layer and a second bottom dielectric isolation layer on a substrate, the superlattice structure comprising a plurality of horizontal channel layers and a corresponding plurality of semiconductor material layers alternatingly arranged in a plurality of stacked pairs.

Additional embodiments of the disclosure are directed to methods of forming a semiconductor device. In one or more embodiments, a method of forming a semiconductor device comprises: depositing a first bottom dielectric isolation layer in a plurality of source trenches and a plurality of drain trenches adjacent to a superlattice structure on a substrate, the superlattice structure on a sacrificial layer on the substrate and comprising a plurality of horizontal channel layers and a corresponding plurality of semiconductor material layers alternatingly arranged in a plurality of stacked pairs; removing the sacrificial layer to form a plurality of openings; depositing a second bottom dielectric isolation layer in the plurality of openings; selectively etching the substrate to form a plurality of backside power rail via openings; selectively removing the first bottom dielectric isolation layer; and depositing a metal in the plurality of backside power rail via openings to form a plurality of vias.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
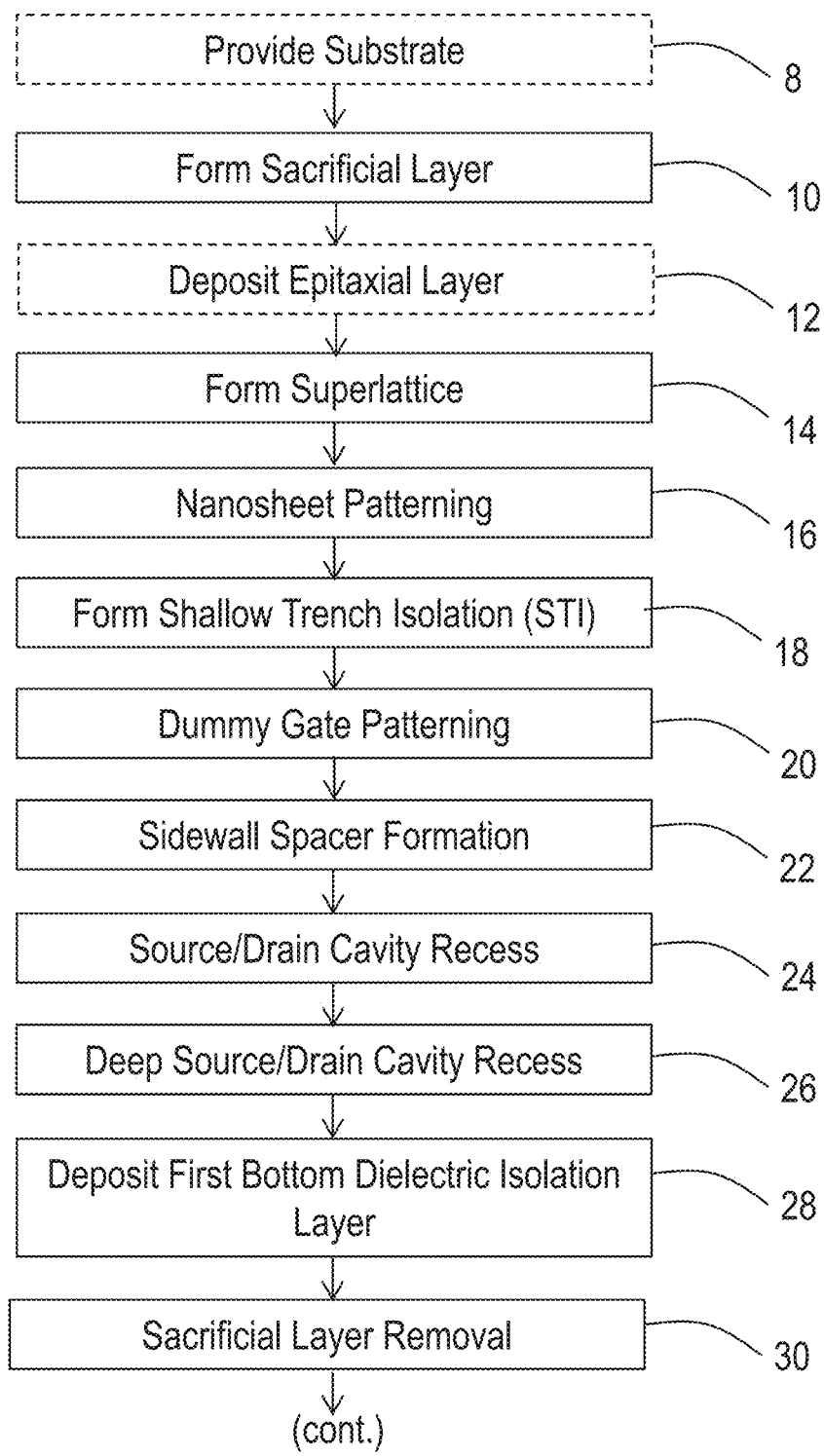
FIG. 1 is a process flow diagram of a method according to one or more embodiments.
Figure 1:
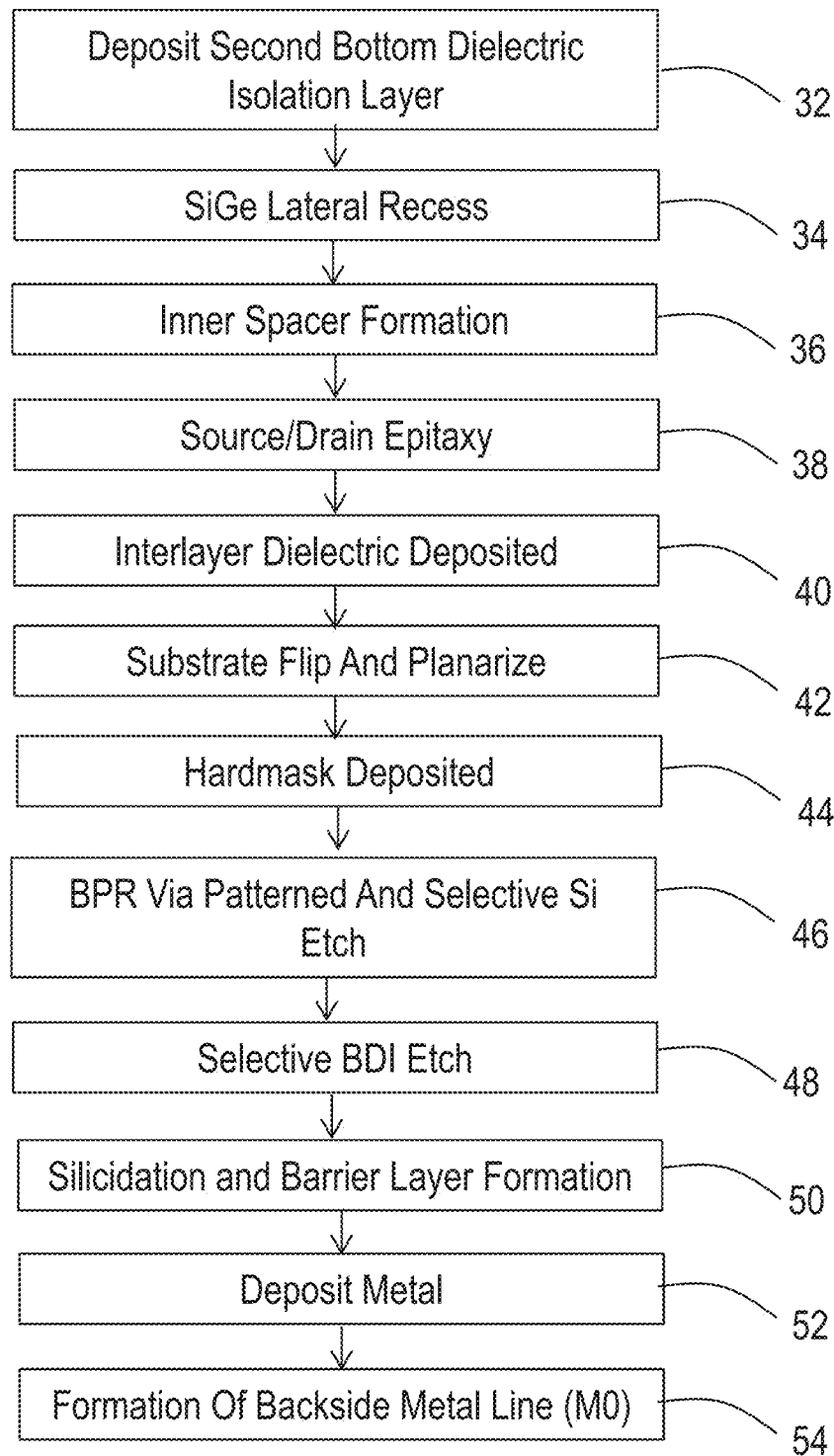

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated Ip. Drain-to-source voltage is designated VDs. By applying voltage to gate (G), the current entering the channel at the drain (i.e., ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, transistors, e.g., gate all-around transistors, are fabricated using a standard process flow. In some embodiments, two different bottom dielectric isolation (BDI) materials are used below the source/drain and gate. In one or more embodiments, selective removal of BDI-dielectric underneath the source/drain advantageously results in better backside power rail (BPR) via alignment to the source/drain epi and reduces possible reliability and gate-shorting issues. Additionally, in one or more embodiments, the BPR-via pattern-size increases for BPR-via leading to lithography requirements relaxation.

In the method of one or more embodiments, transistors, e.g., gate all-around transistors, are fabricated using a standard process flow, as illustrated in FIGS. 2A through 2G. Fabrication proceeds with etching of a portion of the sacrificial layer under the source/drain and filling the opening with a first bottom dielectric isolation material. Then, a second portion of the sacrificial layer under the gate and superlattice is removed, and the opening is filled with a second bottom dielectric isolation material that is different from the first bottom dielectric isolation material. During backside processing, the first bottom dielectric isolation material can be selectivity removed to increase the size of the BPR-via.

Figure 2A:
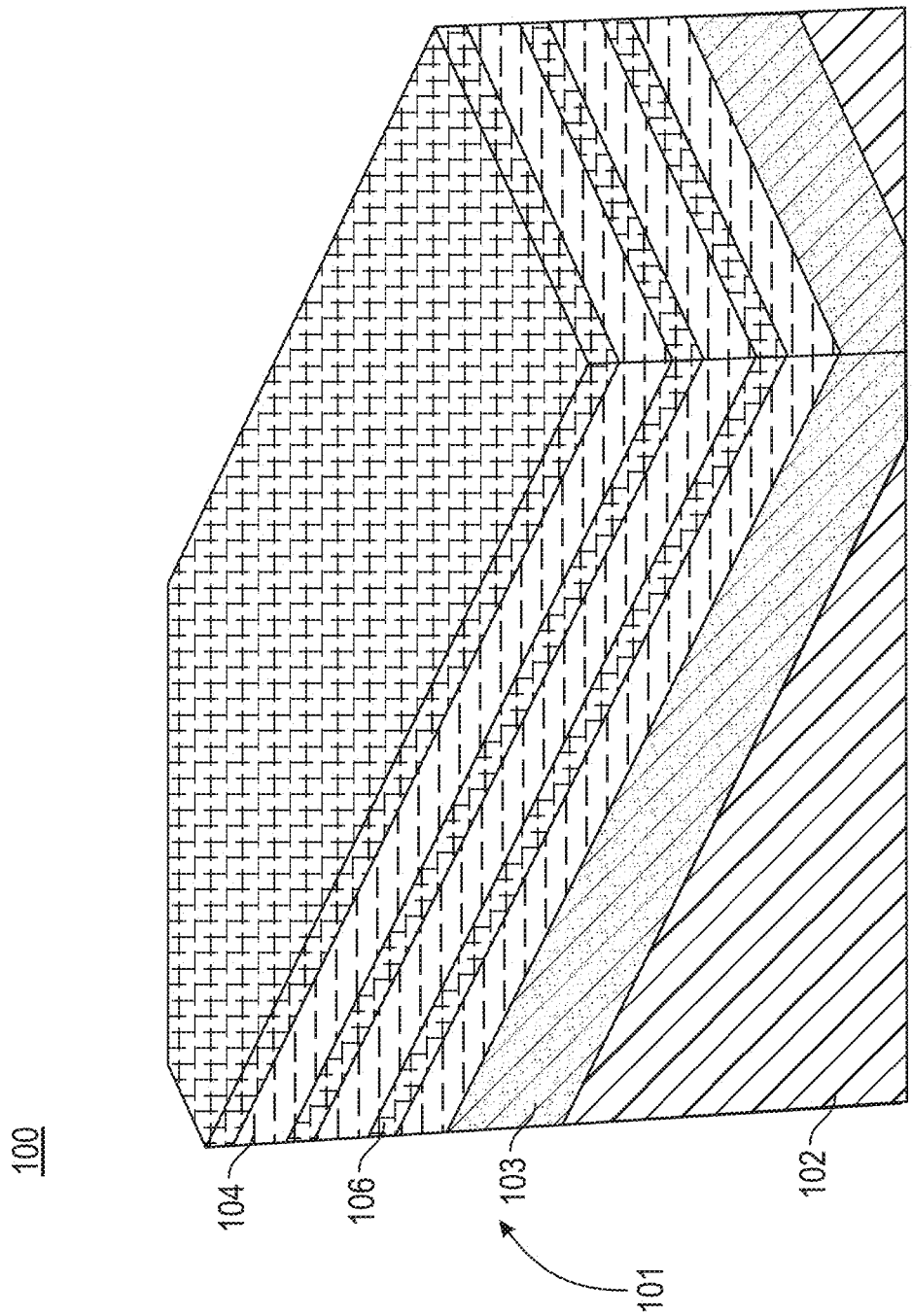
FIGS. 2A-2T illustrate cross-section views of a device according to the method of one or more embodiments.

FIG. 1 illustrates the standard process flow diagram for a method 6 for forming a semiconductor device in accordance with some embodiments of the present disclosure. FIGS. 2A-2T depict the stages of fabrication of semiconductor structures in accordance with the process flow of FIG. 1.

The method 6 is described below with respect to FIGS. 2A-2T. FIGS. 2A-2T are cross-sectional views of an electronic device (e.g., a GAA) according to one or more embodiments. The method 6 may be part of a multi-step fabrication process of a semiconductor device. Accordingly, the method 6 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device. In one or more embodiments, the method 6 is performed in a processing chamber without breaking vacuum.

FIGS. 2A-2T are the fabrication steps of operations 8 thru 54 in FIG. 1. Referring to FIG. 1, the method 6 of forming the device 100 begins at operation 8, by providing a substrate 102. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

With reference to FIGS. 1 and 2A, in some embodiments, at operation 10, a sacrificial layer 103 may be formed on a top surface of the substrate 102. The sacrificial layer 103 may comprise any suitable material known to the skilled artisan. In one or more embodiments, the sacrificial layer 103 comprises silicon germanium (SiGe). In one or more embodiments, the sacrificial layer 103 has a high germanium (Ge) content. In one or more embodiments, the amount of germanium is in a range of from 30% to 50%, including a range of from 35% to 45%. Without intending to be bound by theory, it is thought that the germanium content being in a range of from 30% to 50% leads to increased selectivity of the sacrificial layer 103 and minimizes stress defects. In one or more embodiments, the sacrificial layer 103 has a thickness in a range of from 5 nm to 30 nm.

In one or more unillustrated embodiments, at operation 12, an epitaxial layer, e.g., epitaxial silicon, may be deposited on the sacrificial layer 103. The epitaxial layer may have a thickness is a range of from 20 nm to 100 nm.

Referring to FIG. 1 and FIG. 2A, in one or more embodiments, at operation 14, at least one superlattice structure 101 is formed atop the top surface of the substrate 102 or on a top surface of the sacrificial layer 103 and the optional epitaxial layer. The superlattice structure 101 comprises a plurality of semiconductor material layers 104 and a corresponding plurality of horizontal channel layers 106 alternatingly arranged in a plurality of stacked pairs. In some embodiments the plurality of stacked groups of layers comprises a silicon (Si) and silicon germanium (SiGe) group. In some embodiments, the plurality of semiconductor material layers 104 comprise silicon germanium (SiGe), and the plurality of horizontal channel layers 106 comprise silicon (Si). In other embodiments, the plurality of horizontal channel layers 106 comprise silicon germanium (SiGe), and the plurality of semiconductor materials layers 106 comprise silicon (Si).

In some embodiments, the plurality of semiconductor material layers 104 and corresponding plurality of horizontal channel layers 106 can comprise any number of lattice matched material pairs suitable for forming a superlattice structure 101. In some embodiments, the plurality of semiconductor material layers 104 and corresponding plurality of horizontal channel layers 106 comprise from about 2 to about 50 pairs of lattice matched materials.

In one or more embodiments, the thickness of the plurality of semiconductor material layers 104 and the plurality of horizontal channel layers 106 are in the range of from about 2 nm to about 50 nm, in the range of from about 3 nm to about 20 nm, or in a range of from about 2 nm to about 15 nm.

Figure 2B:
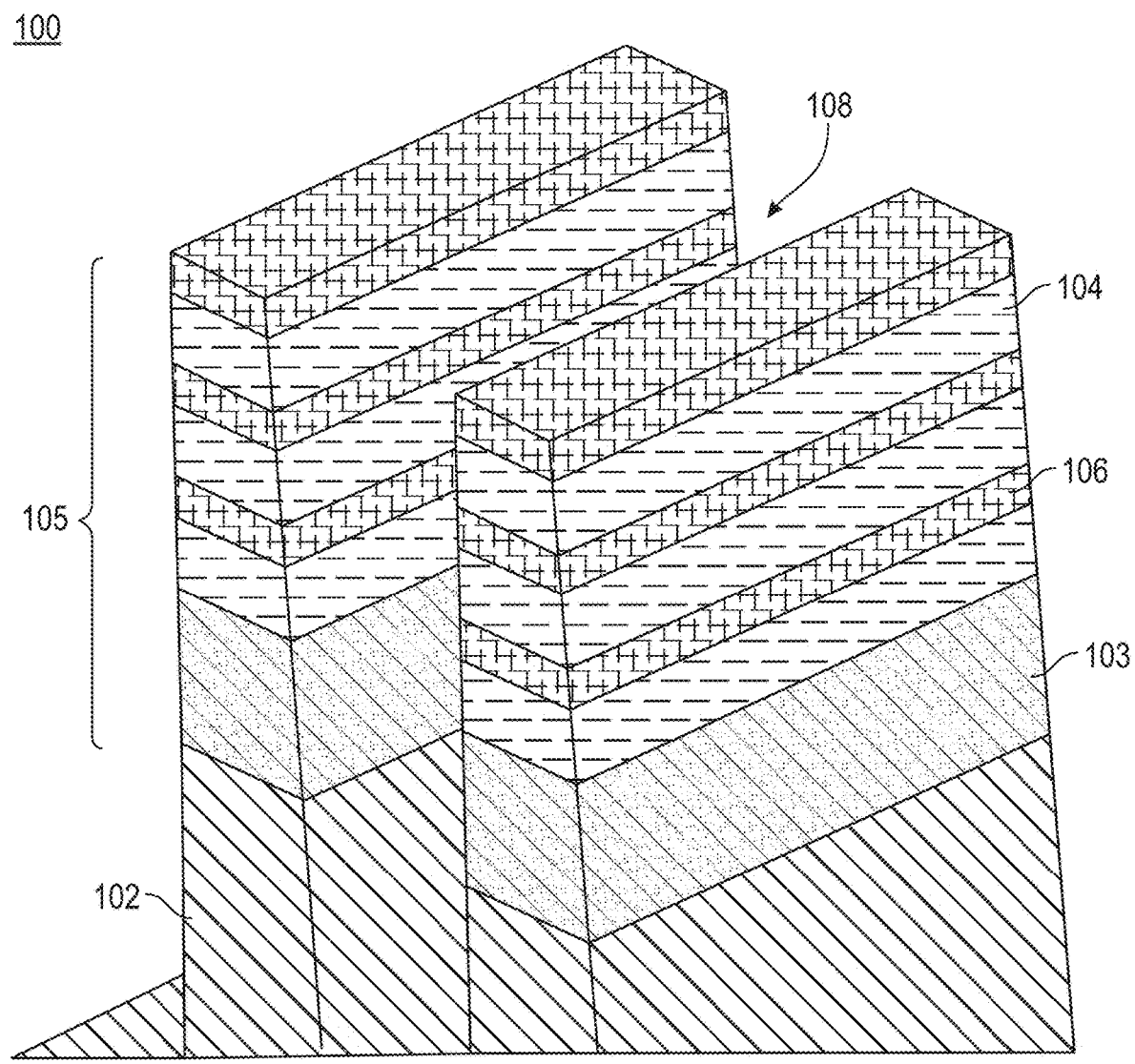

With reference to FIG. 1 and FIG. 2B, in one or more embodiments, at operation 16, the superlattice structure 101 is patterned to form an opening 108 between adjacent stacks 105. The patterning may be done by any suitable means known to the skilled artisan. As used in this regard, the term "opening" means any intentional surface irregularity. Suitable examples of openings include, but are not limited to, trenches which have a top, two sidewalls and a bottom. Openings can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

Figure 2C:
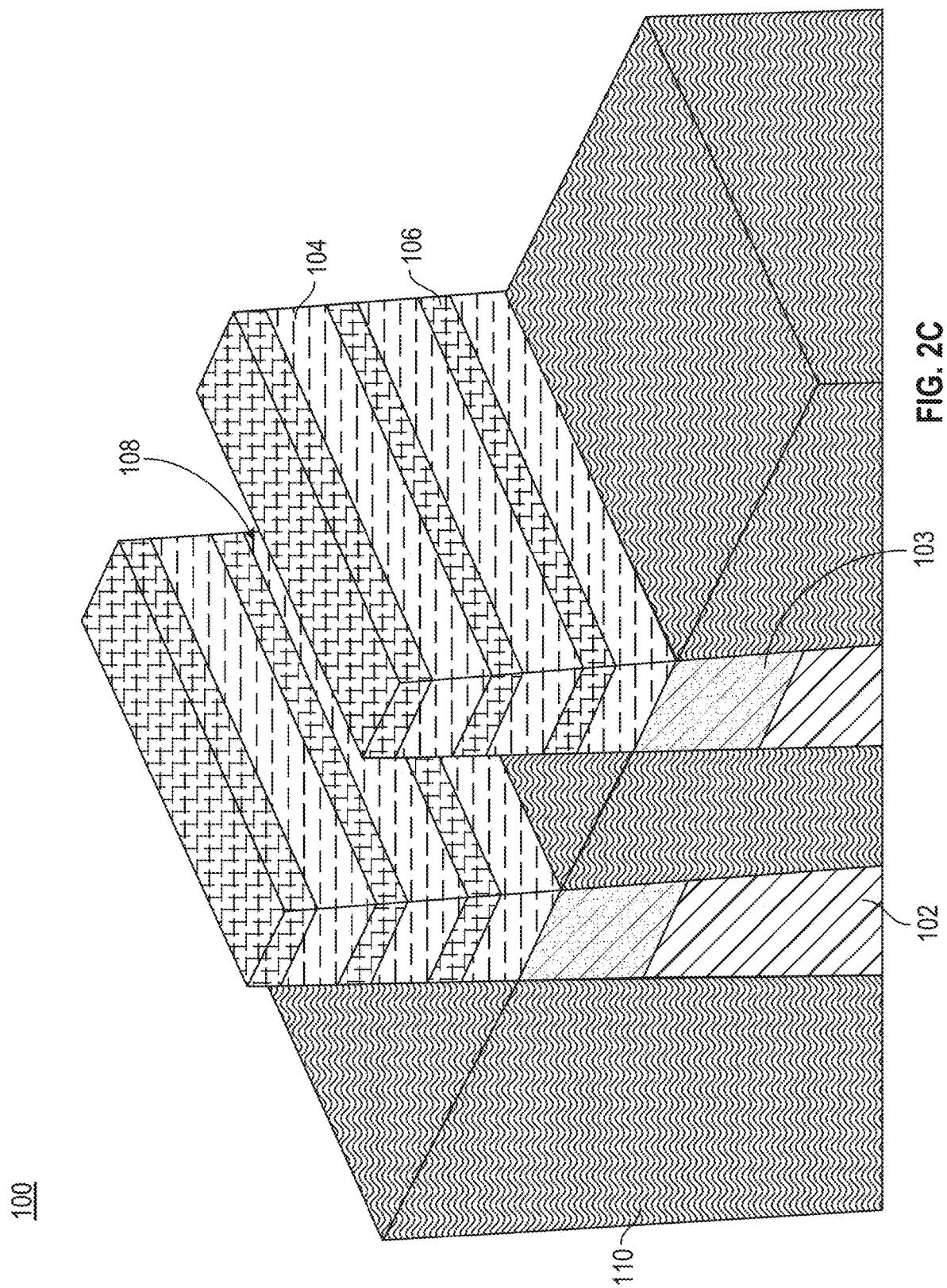

Referring to FIG. 1 and FIG. 2C, at operation 18, a shallow trench isolation (STI) 110 is formed. As used herein, the term "shallow trench isolation (STI)" refers to an integrated circuit feature which prevents current leakage. In one or more embodiments, STI is created by depositing one or more dielectric materials (such as silicon dioxide) to fill the trench or opening 108 and removing the excess dielectric using a technique such as chemical-mechanical planarization.

Figure 2D:
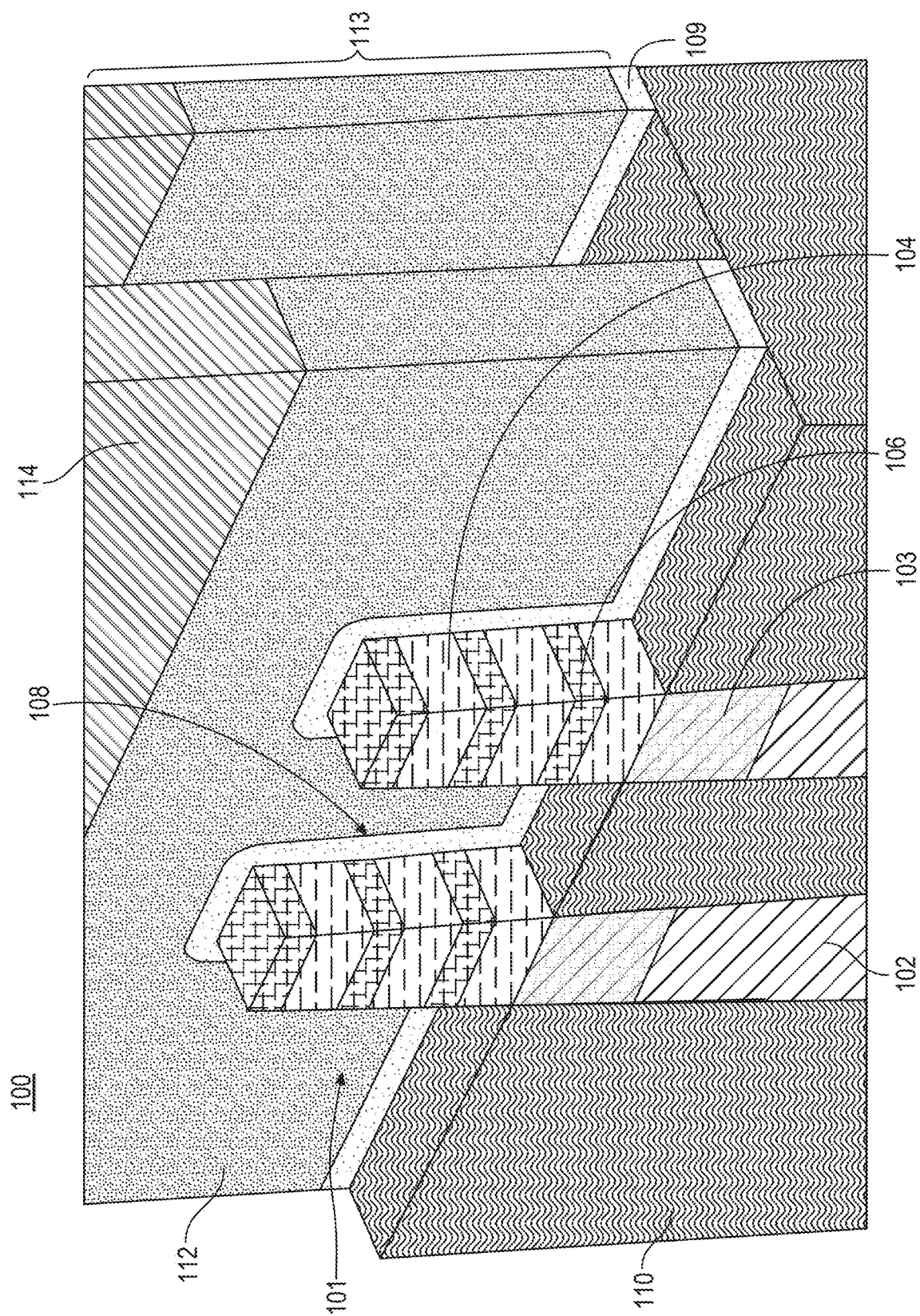

With reference to FIG. 1 and FIG. 2D, at operation 20, in some embodiments, a dummy gate structure 113 is formed over and adjacent to the superlattice structure 101. The dummy gate structure 113 defines the channel region of the transistor device. The dummy gate structure 113 may be formed using any suitable conventional deposition and patterning process known in the art.

In one or more embodiments, the dummy gate structure 113 comprises one or more of a gate material 114 and a poly-silicon layer 112. In some embodiments, the dummy gate structure 113 may also include a dielectric layer 109 between the superlattice structure and the poly-silicon layer 112. In one or more embodiments, the gate structure 113 comprises one or more of tungsten (W), cobalt (Co), molybdenum (Mo), ruthenium (Ru), titanium nitride (TiN), tantalum nitride (TaN), titanium aluminum (TiAl), and N doped polysilicon.

Figure 2E:
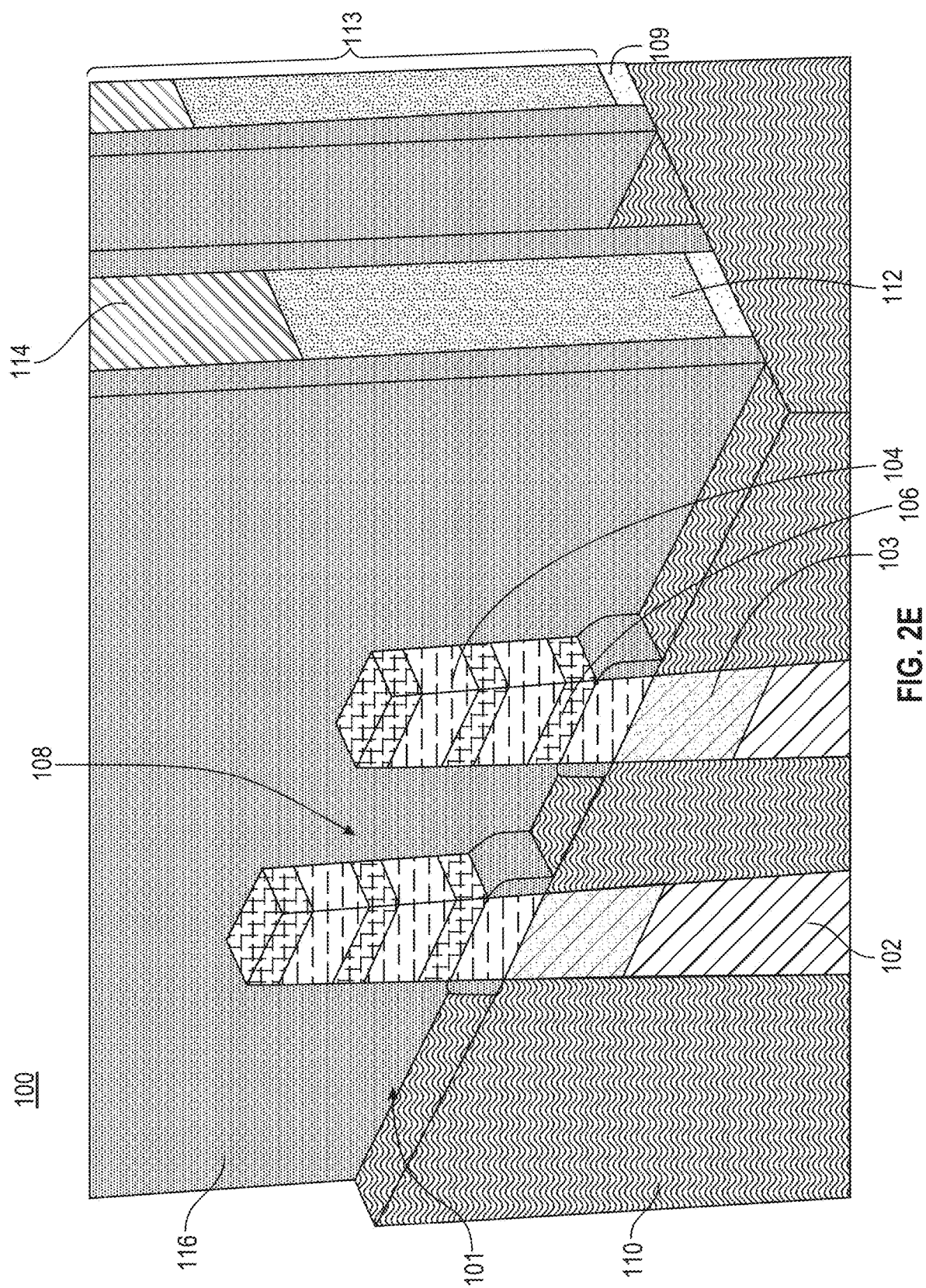
Figure 2F:
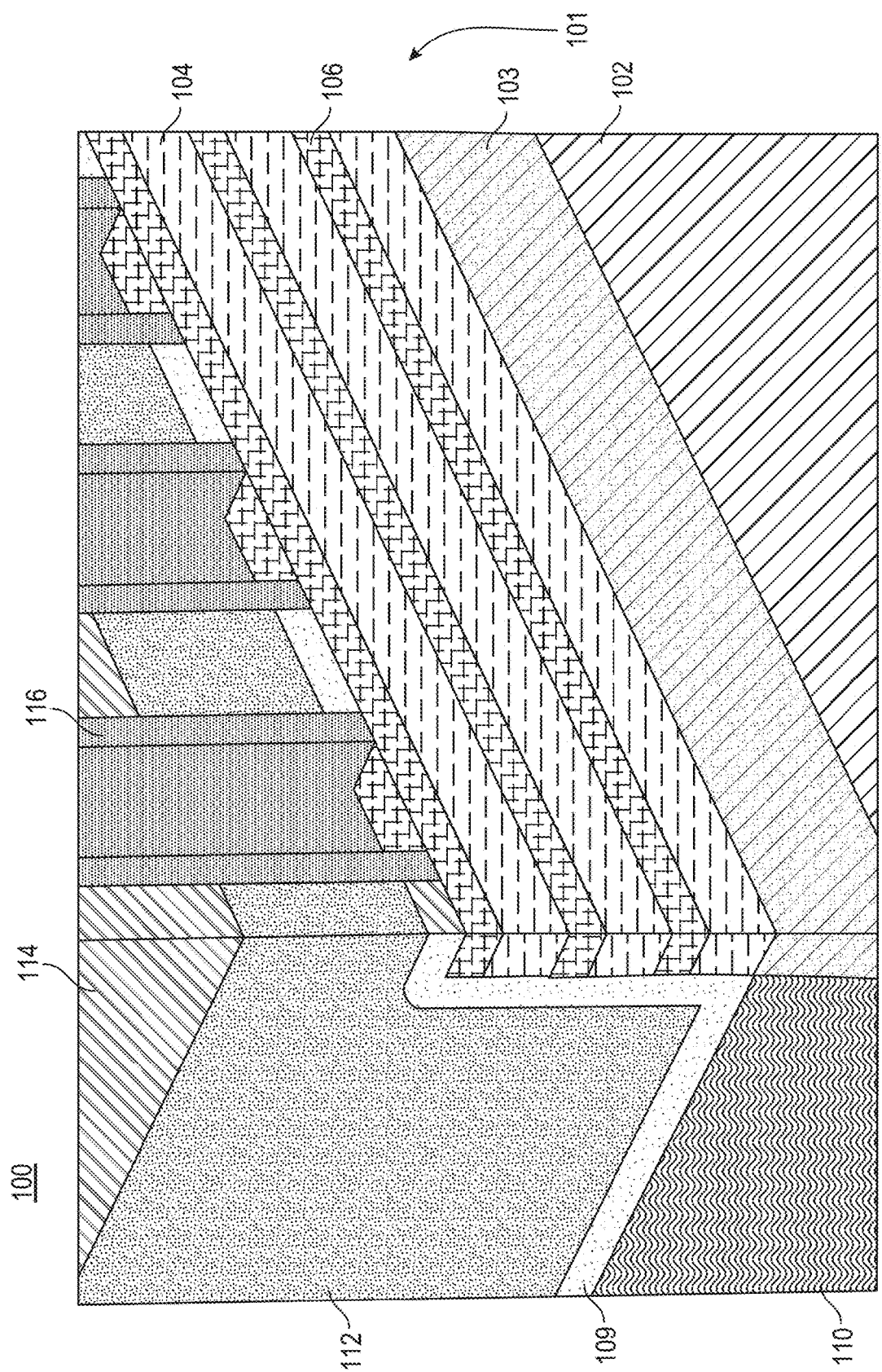

Referring to FIG. 1 and FIG. 2E, in some embodiments, at operation 22, sidewall spacers 116 are formed along outer sidewalls of the dummy gate structure 113 and on the superlattice 101. The sidewall spacers 116 may comprise any suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition. FIG. 2F provides an alternative view 100B illustrating the device after the sidewall spacers 116 are formed.

Figure 2G:
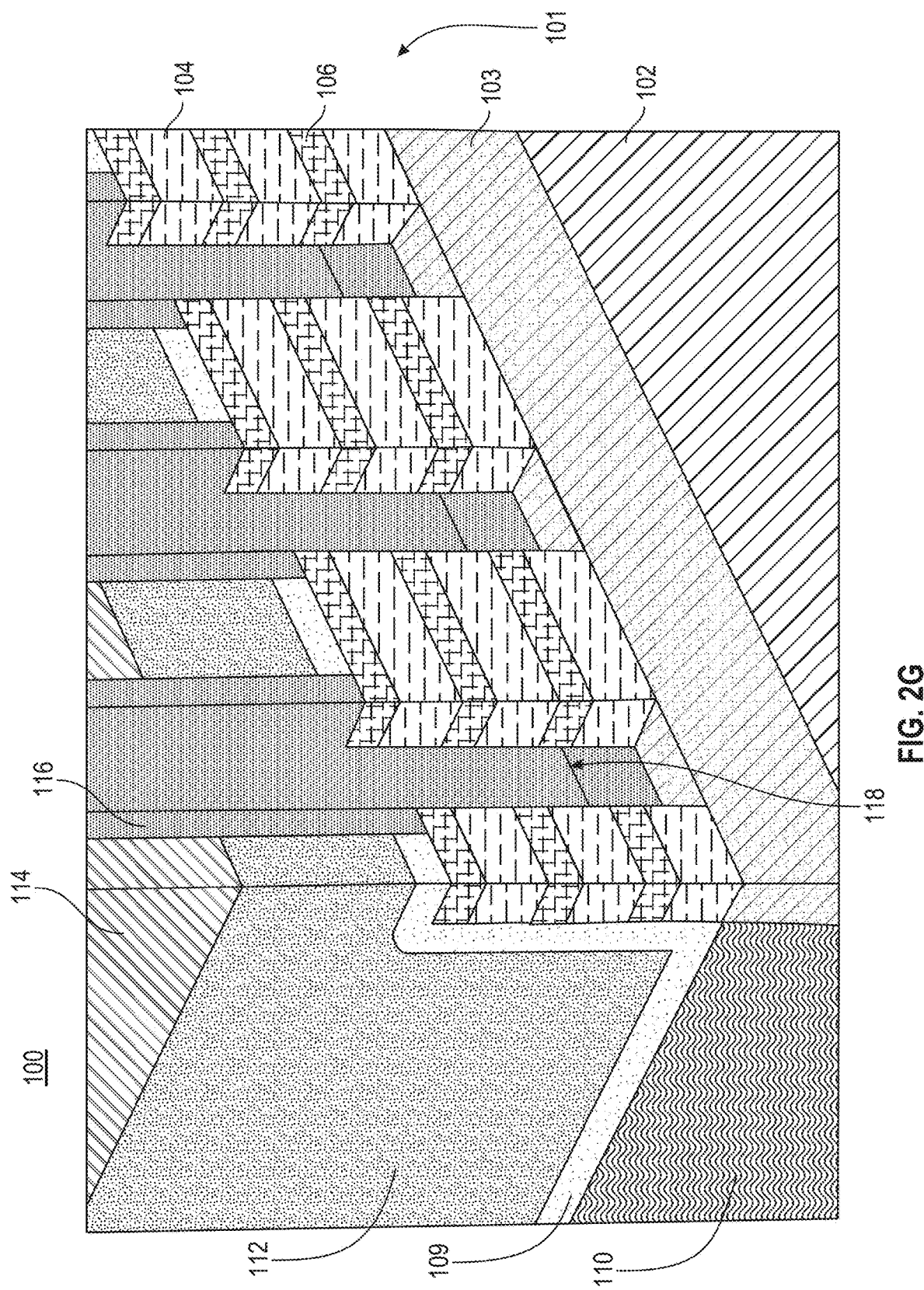

Referring to FIG. 1 and FIG. 2G, at operation 24, in one or more embodiments, source/drain trenches 118 are formed adjacent (i.e., on either side) the superlattice structure 101. In one or more embodiments, the source/drain trenches 118 extend through the superlattice structure 101 to the sacrificial layer 103.

Figure 2H:
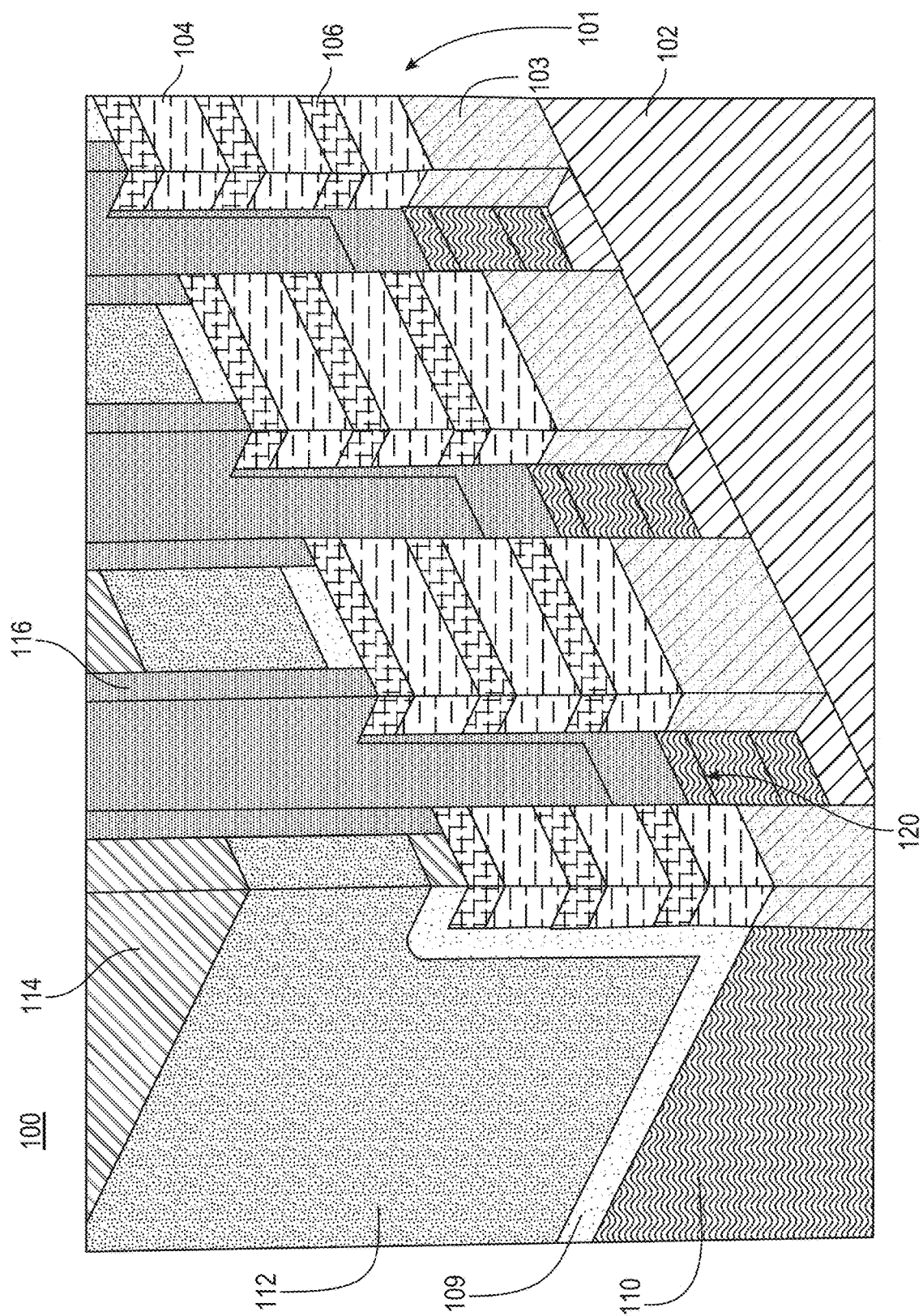

With reference to FIG. 1 and FIG. 2H, at operation 26, in one or more embodiments, the source/drain trenches 118 are deepened by etching the sacrificial layer 103 under the source/drain region to form cavities 120 under the source/drain. The cavities 120 may have any suitable depth and width. In one or more embodiments, the cavity 120 extends through the sacrificial layer 103 to the substrate 102 and has a width the distance between two adjacent superlattice structures 101. In one or more embodiments, the sacrificial layer 103 is removed during the formation of the cavity 120 etch such that the cavity 120 extends to the substrate 102.

The cavity 120 may be formed by any suitable means known to the skilled artisan. The etch process of operation 26 may include any suitable etch process that is selective to the source drain trenches 118. In some embodiments the etch process of operation 26 comprises one or more of reactive ion etching, a wet etch process or a dry etch process. The etch process may be a directional etch.

In some embodiments, the dry etch process may include a conventional plasma etch, or a remote plasma-assisted dry etch process. In an etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The etch process may be performed in any preclean chamber, which may be integrated into one of a variety of multi-processing platforms. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2I:
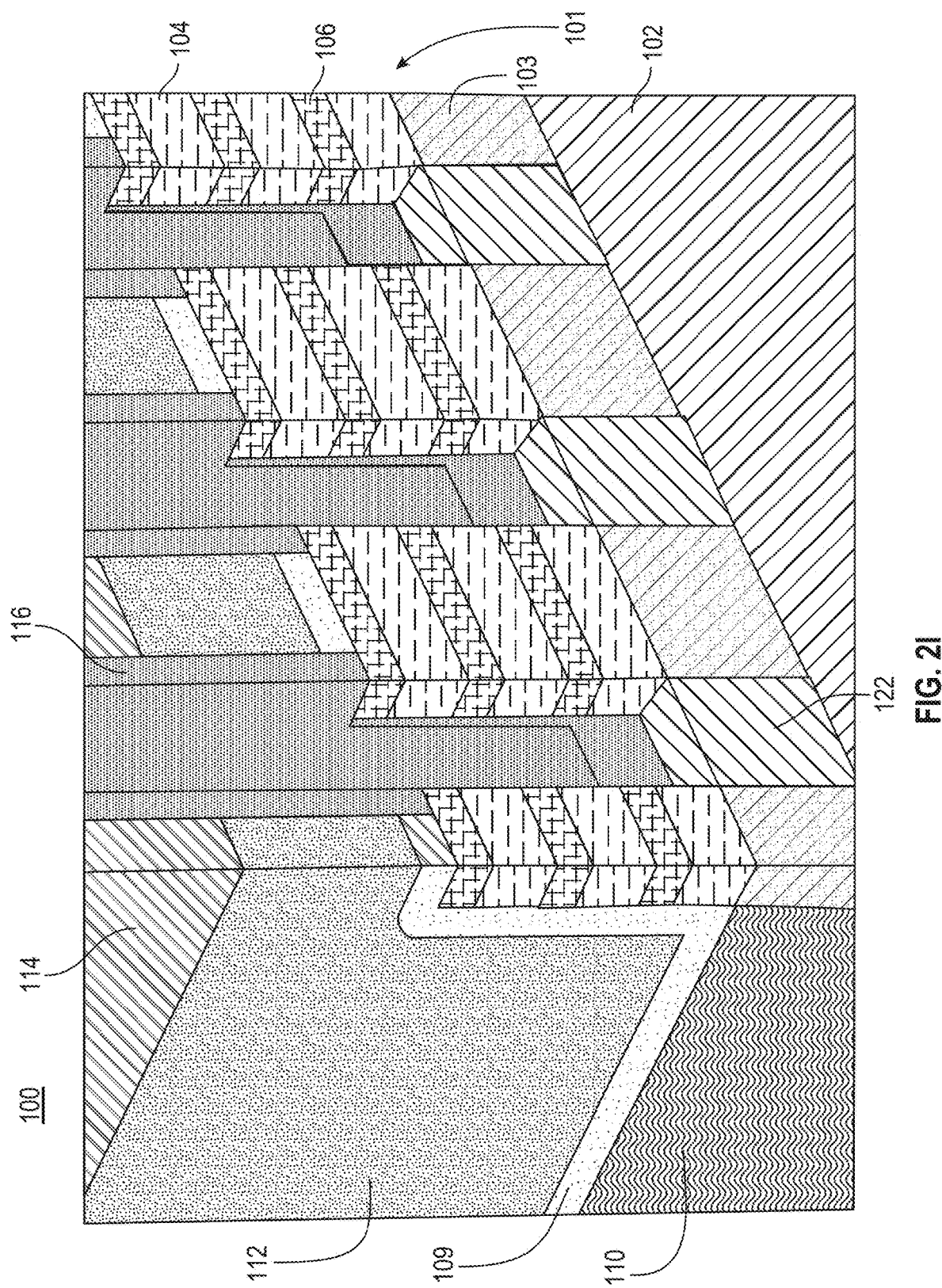

Referring to FIG. 1 and FIG. 2I, at operation 28, a bottom dielectric isolation (BDI) layer 122 is deposited in the cavity 120. The bottom dielectric isolation (BDI) layer 122 may comprise any suitable material known to the skilled artisan. In one or more embodiments, the bottom dielectric isolation (BDI) layer 122 may comprise any suitable material that has a different etch rate than the shallow trench isolation 110, the substrate 102, and the sacrificial layer 103. In one or more embodiments, the bottom dielectric isolation (BDI) layer 122 comprises a dielectric material. As used herein, the term "dielectric material" refers to an electrical insulator that can be polarized in an electric field. In some embodiments, the dielectric material comprises one or more of oxides, carbon doped oxides, silicon dioxide (SiO), porous silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the bottom dielectric isolation (BDI) layer 122 includes one or more of silicon oxide (SiOx), silicon nitride (SiN), silicon carbide (SiC), boron doped silicon, carbon doped silicon oxynitride (SiOCN), silicon doped boron, metal, metal oxide, metal silicide, metal carbide, and high-K material. In some embodiments, the high-K material is selected from one or more of aluminum oxide ($Al_2O_3$), hafnium oxide ($HfO_2$), and the like. In one or more specific embodiments, the bottom dielectric isolation (BDI) layer 122 comprises a carbon-doped silicon oxynitride (SiOCN) material. In some embodiments, the bottom dielectric isolation (BDI) layer 122 is deposited on the substrate 102 using conventional chemical vapor deposition methods.

Figure 2J:
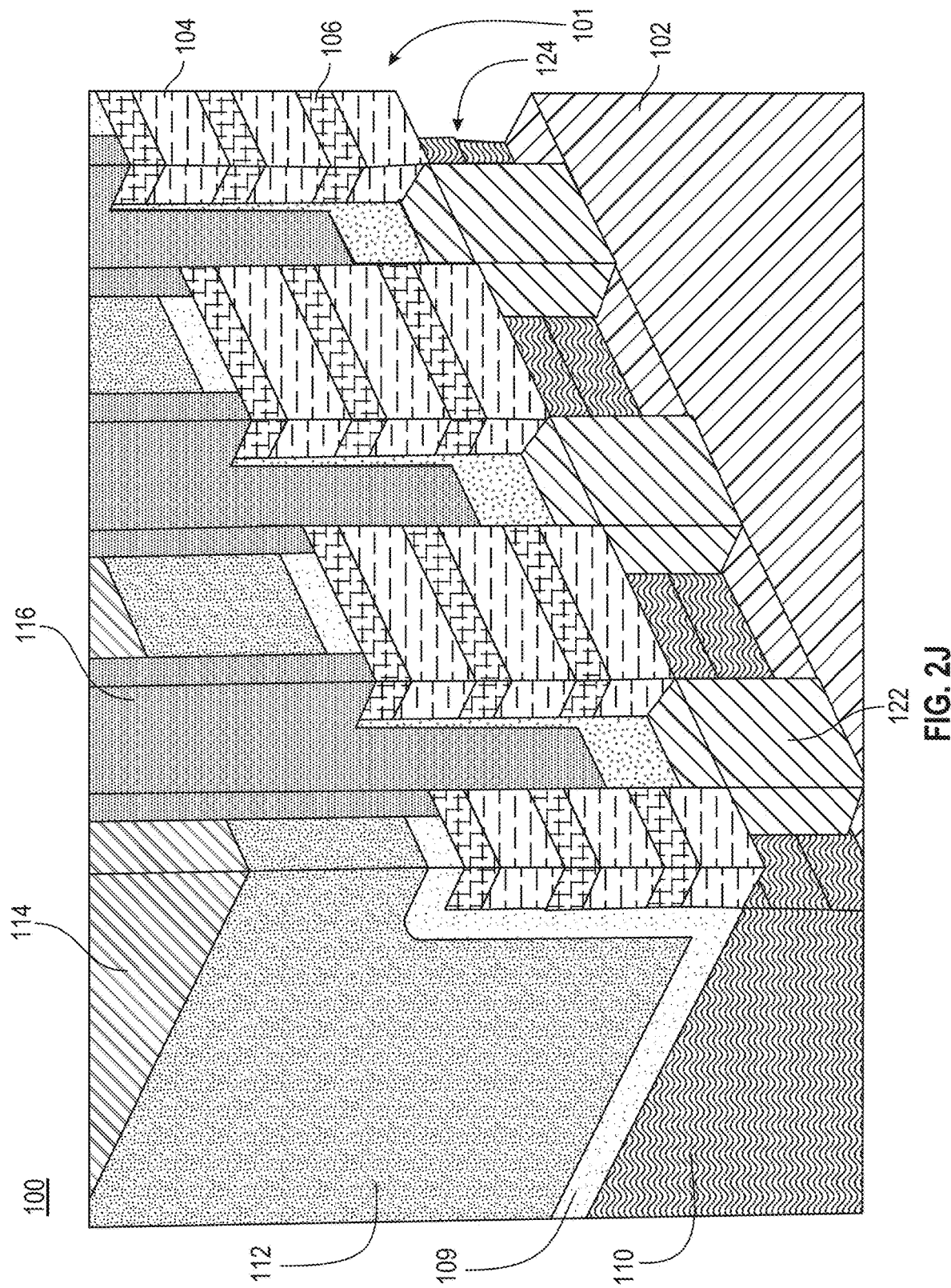

Referring to FIG. 1 and FIG. 2J, at operation 30, the sacrificial layer 103 that remains under the superlattice is selectively removed to form an opening 124 under the gate. The opening 124 extends from the superlattice structure 101 to the substrate 102.

The opening 124 may be formed by any suitable means known to the skilled artisan. The etch process of operation 30 may include any suitable etch process that is selective to the sacrificial layer 103 over the bottom dielectric isolation (BDI) layer 122. In some embodiments the etch process of operation 30 comprises one or more of reactive ion etching, a wet etch process or a dry etch process.

Figure 2K:
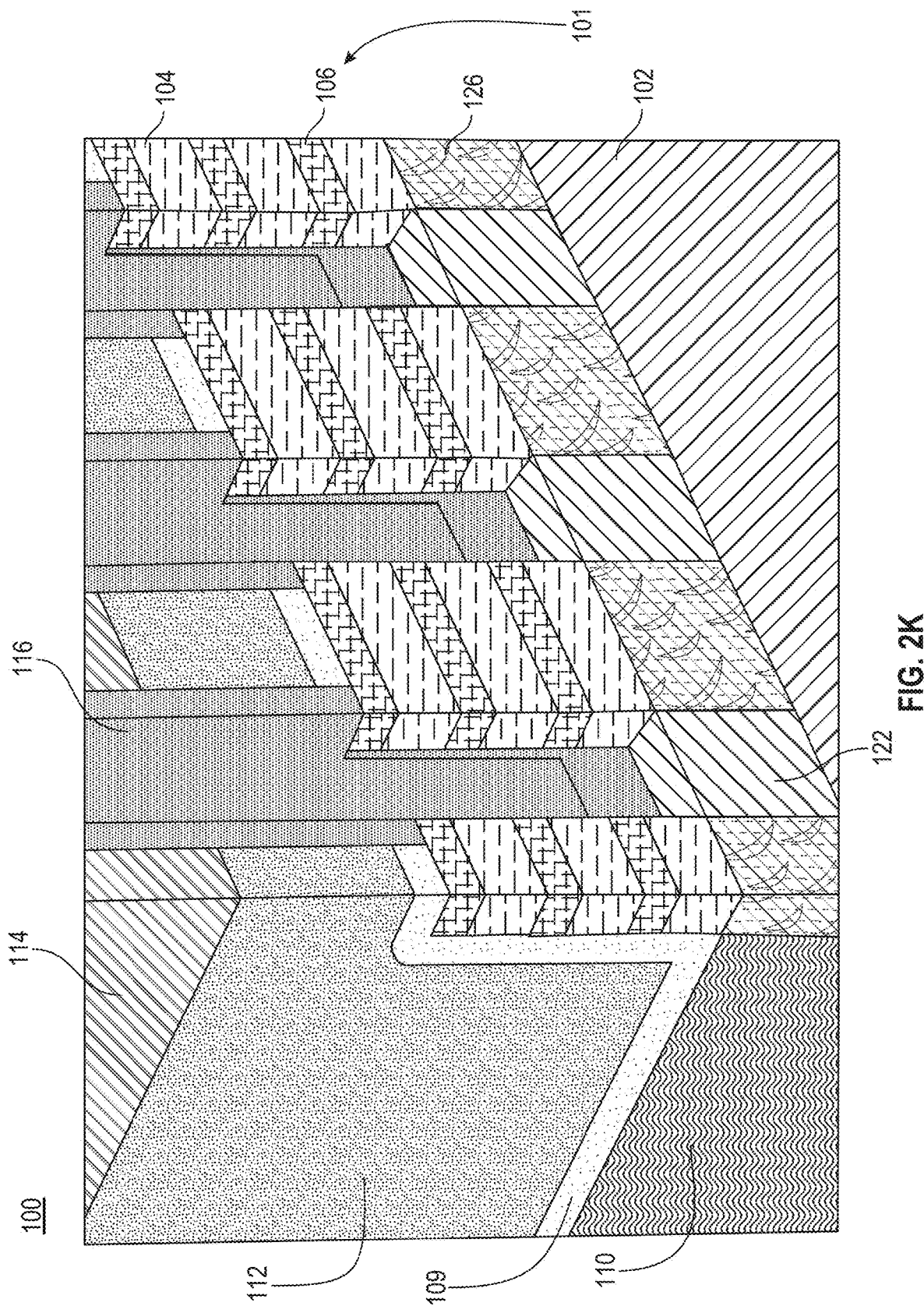

Referring to FIG. 1 and FIG. 2K, at operation 32, a second bottom dielectric isolation (BDI) layer 126 is deposited in the opening 124. The second bottom dielectric isolation (BDI) layer 126 may comprise any suitable material known to the skilled artisan. The second bottom dielectric isolation (BDI) layer 126 is a different material than the first bottom dielectric isolation (BDI) layer 122, such that the second bottom dielectric isolation layer 126 and the first bottom dielectric isolation (BDI) layer 122 have different etch selectivity. In one or more embodiments, the second bottom dielectric isolation (BDI) layer 126 may comprise any suitable material that has a different etch rate than the first bottom dielectric isolation (BID) layer 122 and the shallow trench isolation 110. In one or more embodiments, second bottom dielectric isolation (BDI) layer 126 comprises a dielectric material. In some embodiments, the dielectric material comprises one or more of oxides, carbon doped oxides, silicon dioxide (SiO), porous silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the second bottom dielectric isolation (BDI) layer 126 includes one or more of silicon oxide (SiOx), silicon nitride (SiN), silicon carbide (SiC), boron doped silicon, carbon doped silicon oxynitride (SiOCN), silicon doped boron, metal, metal oxide, metal silicide, metal carbide, and high-κ material. In some embodiments, the high-κ material is selected from one or more of aluminum oxide ($Al_2O_3$), hafnium oxide ($HfO_2$), and the like. In one or more specific embodiments, the second bottom dielectric isolation (BDI) layer 126 comprises carbon-doped silicon oxynitride (SiOCN). In one or more embodiments, the first bottom dielectric isolation layer 122 comprises carbon doped silicon oxynitride (SiOCN) and the second bottom dielectric isolation layer 126 carbon doped silicon oxynitride (SiOCN) having a different composition than the first bottom dielectric isolation layer 122 to provide etch selectivity when compared to the first bottom dielectric isolation layer 122. In some embodiments, the second bottom dielectric isolation (BDI) layer 126 is deposited on the substrate 102 using conventional chemical vapor deposition methods.

Figure 2L:
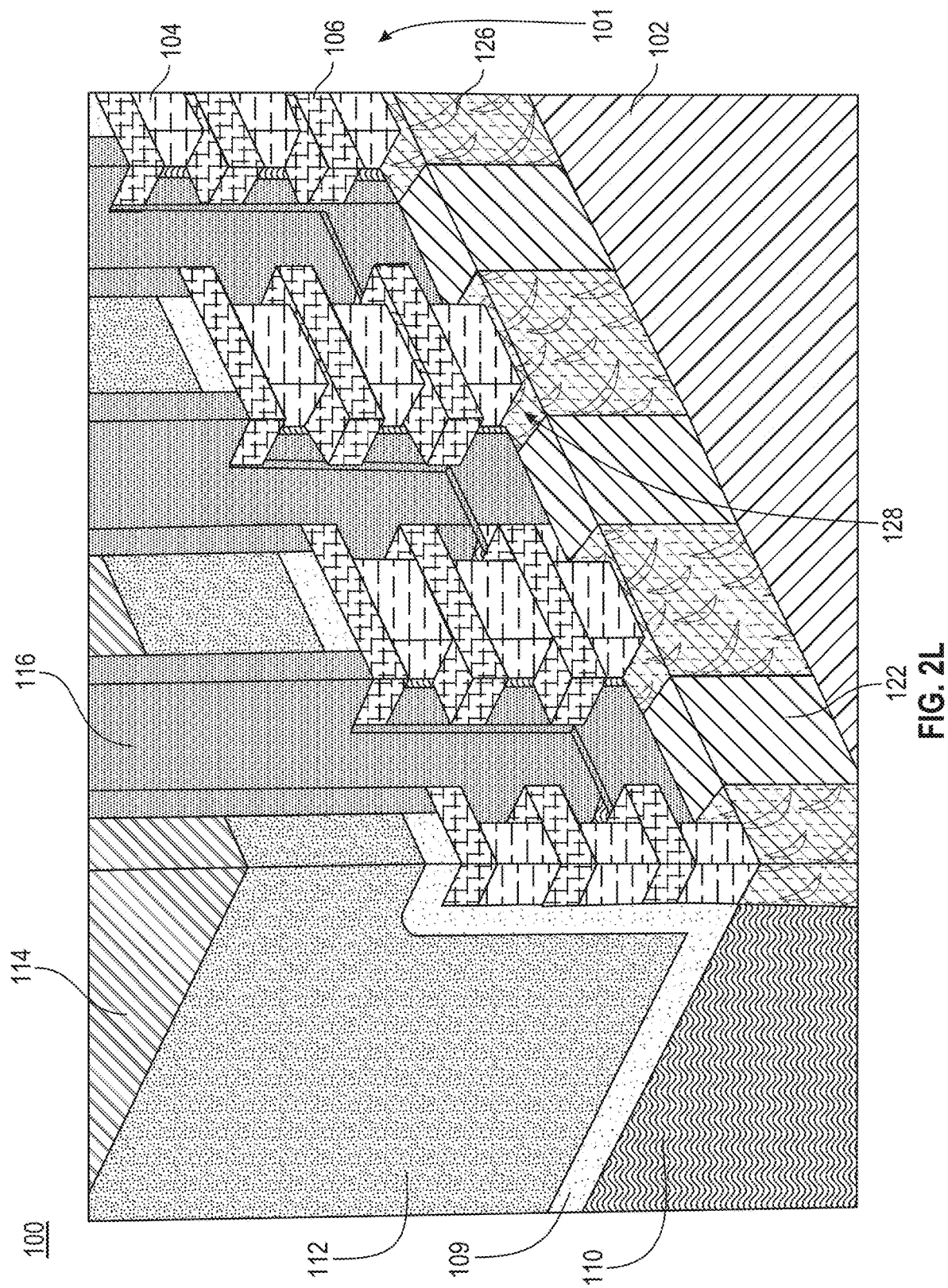

Referring to FIG. 1 and FIG. 2L, at operation 34, the plurality of semiconductor material layers 104 are recessed laterally to form a recessed region 128.

Figure 2M:
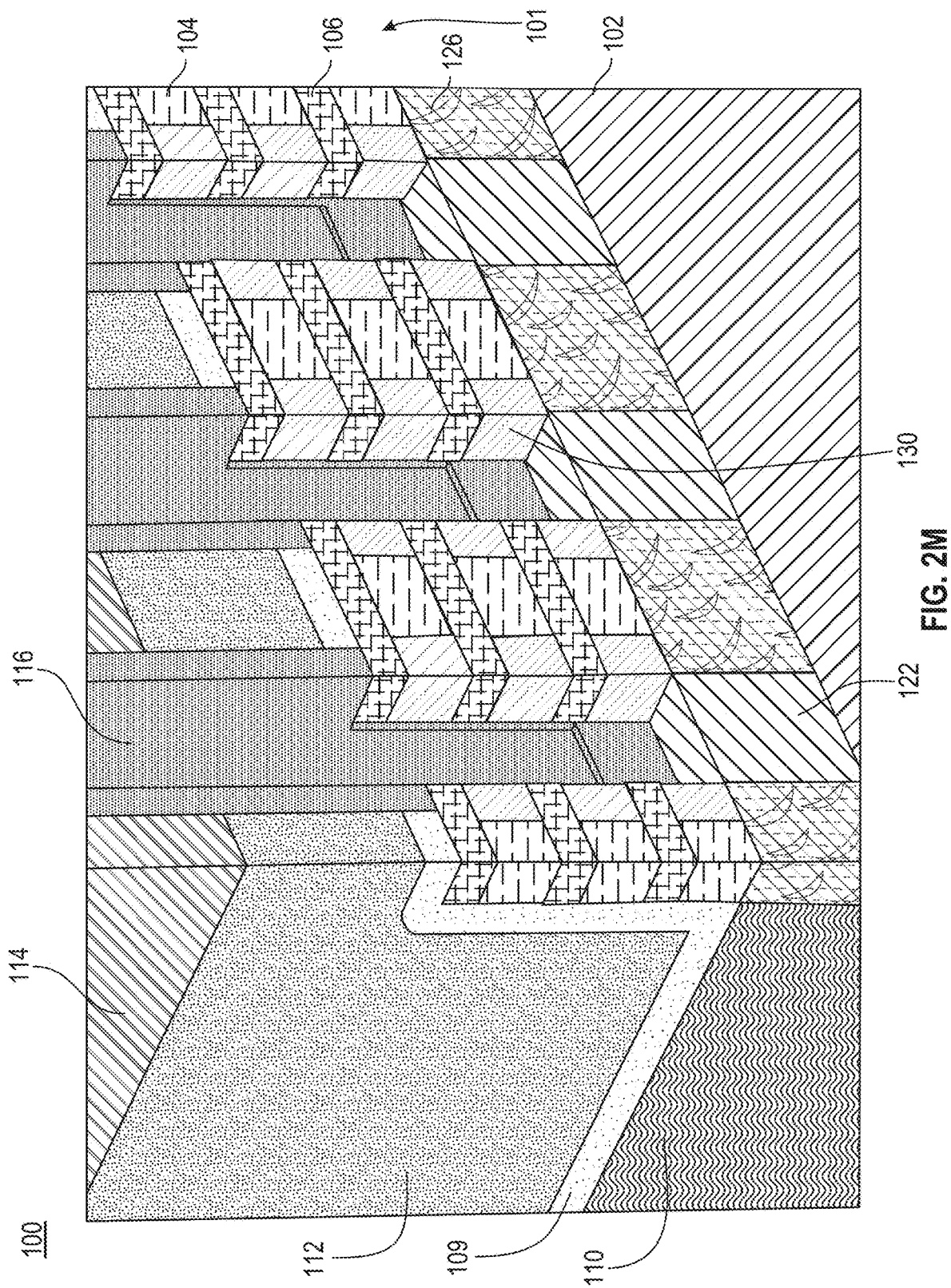

Referring to FIG. 1 and FIG. 2M, at operation 36, an inner spacer layer 130 is formed on a top surface of each of the horizontal channel layers 106 in the recessed region 128. The inner spacer layer 130 may comprise any suitable material known to the skilled artisan. In one or more embodiments, the inner spacer layer 130 comprises a nitride material. In specific embodiments, the inner spacer layer 130 comprises silicon nitride.

Figure 2N:
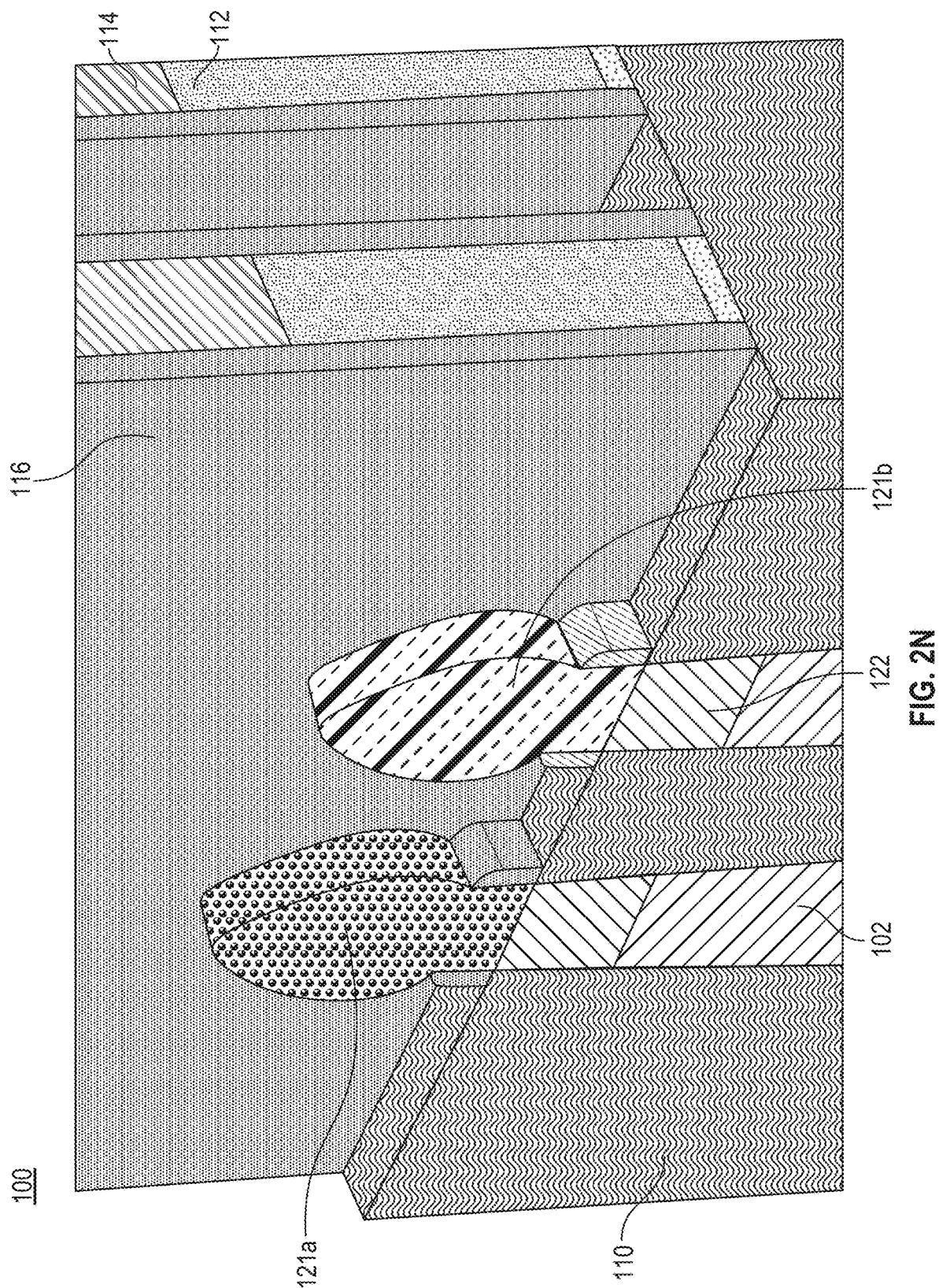
Figure 20:
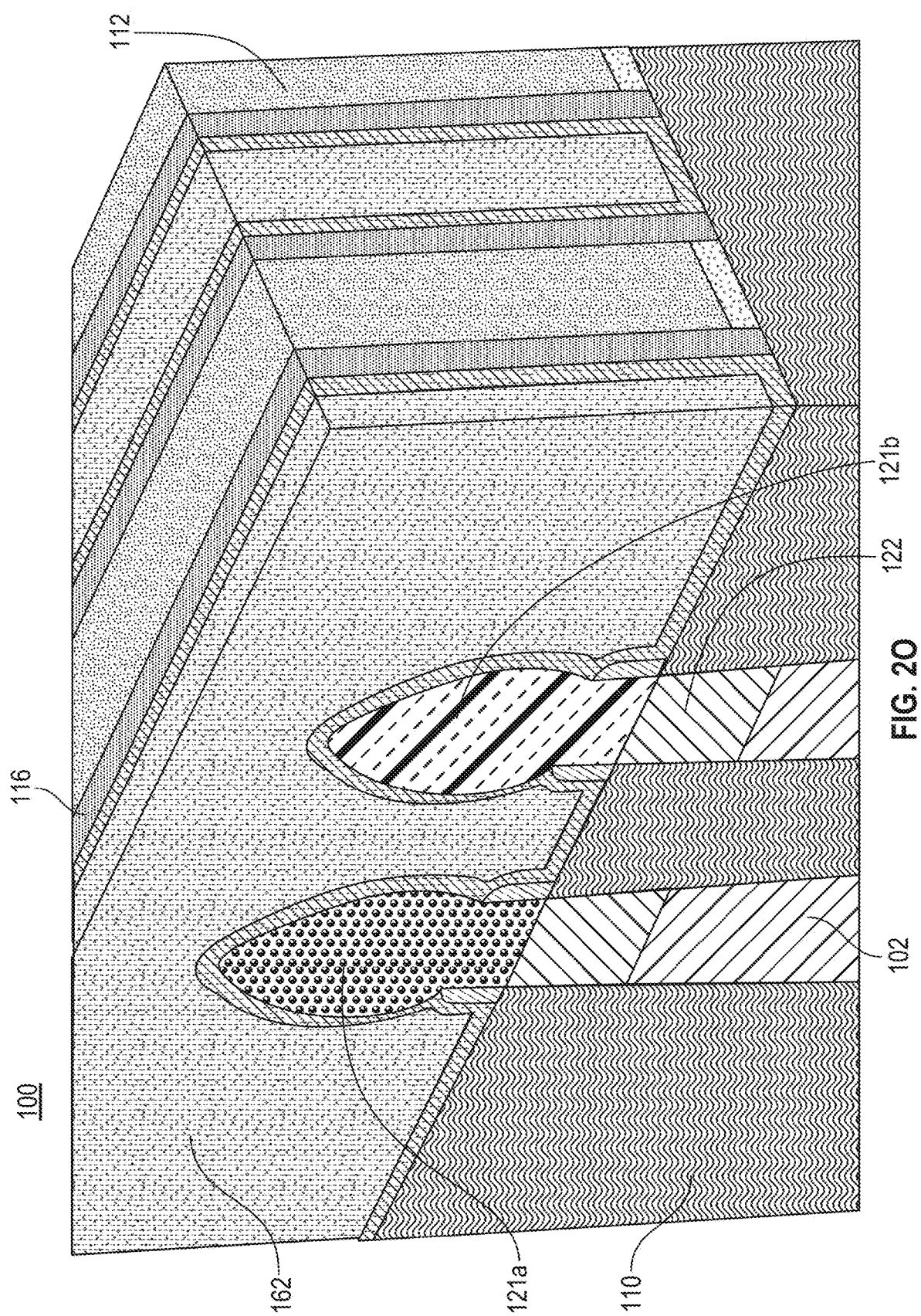

With reference to FIG. 1 and to FIG. 2N, at operation 38, in some embodiments, the embedded source/drain 121a, 121b regions form. In some embodiments, the embedded source 121a is formed adjacent a first end of the superlattice structure 101 and the drain 121b is formed adjacent a second, opposing end of the superlattice structure 101. In some embodiments, the source/drain 121a, 121b regions are formed from any suitable semiconductor material, such as but not limited to silicon (Si), germanium (Ge), silicon germanium (SiGe), silicon phosphorous (SiP), silicon arsenic (SiAs), or the like. In some embodiments, the source/drain 121a, 121b regions may be formed using any suitable deposition process, such as an epitaxial deposition process. In some embodiments, the source/drain 121a, 121b regions are independently doped with one or more of phosphorus (P), arsenic (As), boron (B), and gallium (Ga).

Referring to FIG. 1 and FIG. 2O, at operation 40, an inter-layer dielectric (ILD) layer 162 is blanket deposited over the substrate 102, the dummy gate structure 113, and the sidewall spacers 116. The ILD layer 162 may be deposited using a conventional chemical vapor deposition method (e.g., plasma enhance chemical vapor deposition and low-pressure chemical vapor deposition). In one or more embodiments, ILD layer 162 is formed from any suitable dielectric material such as, but not limited to, undoped silicon oxide, doped silicon oxide (e.g., BPSG, PSG), silicon nitride, and silicon oxynitride. In one or more embodiments, ILD layer 162 is then polished back using a conventional chemical mechanical planarization method to expose the top of the dummy gate structure 113. In some embodiments, the ILD layer 162 is polished to expose the top of the dummy gate structure 113 and the top of the sidewall spacers 116.

In one or more unillustrated embodiments, the formation of the semiconductor device, e.g., GAA, continues according to traditional procedures with nanosheet release and replacement metal gate formation. Specifically, in one or more unillustrated embodiments, the plurality of semiconductor material layers 104 are selectively etched between the plurality of horizontal channel layers 106 in the superlattice structure 101. For example, where the superlattice structure 101 is composed of silicon (Si) layers and silicon germanium (SiGe) layers, the silicon germanium (SiGe) is selectively etched to form channel nanowires. The plurality of semiconductor material layers 104, for example silicon germanium (SiGe), may be removed using any well-known etchant that is selective to the plurality of horizontal channel layers 106 where the etchant etches the plurality of semiconductor material layers 104 at a significantly higher rate than the plurality of horizontal channel layers 106. In some embodiments, a selective dry etch or wet etch process may be used. In some embodiments, where the plurality of horizontal channel layers 106 are silicon (Si) and the plurality of semiconductor material layers 104 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the plurality of semiconductor material layers 104 leaves voids between the plurality of horizontal channel layers 106.

The voids between the plurality of horizontal channel layers 106 have a thickness of about 3 nm to about 20 nm. The remaining horizontal channel layers 106 form a vertical array of channel nanowires that are coupled to the source/drain 121a, 121b regions. The channel nanowires run parallel to the top surface of the substrate 102 and are aligned with each other to form a single column of channel nanowires.

In one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric to form the replacement metal gate. The conductive material may be formed using any suitable deposition process such as, but not limited to, atomic layer deposition (ALD) in order to ensure the formation of a layer having a uniform thickness around each of the plurality of channel layers.

In one or more unillustrated embodiments, a drain contact to transistor (CT) and contact to gate (CG) are formed. Additionally, the metal (M0) line and metal (M1) line is formed and electrically connected to the via (V1).

Figure 2P:
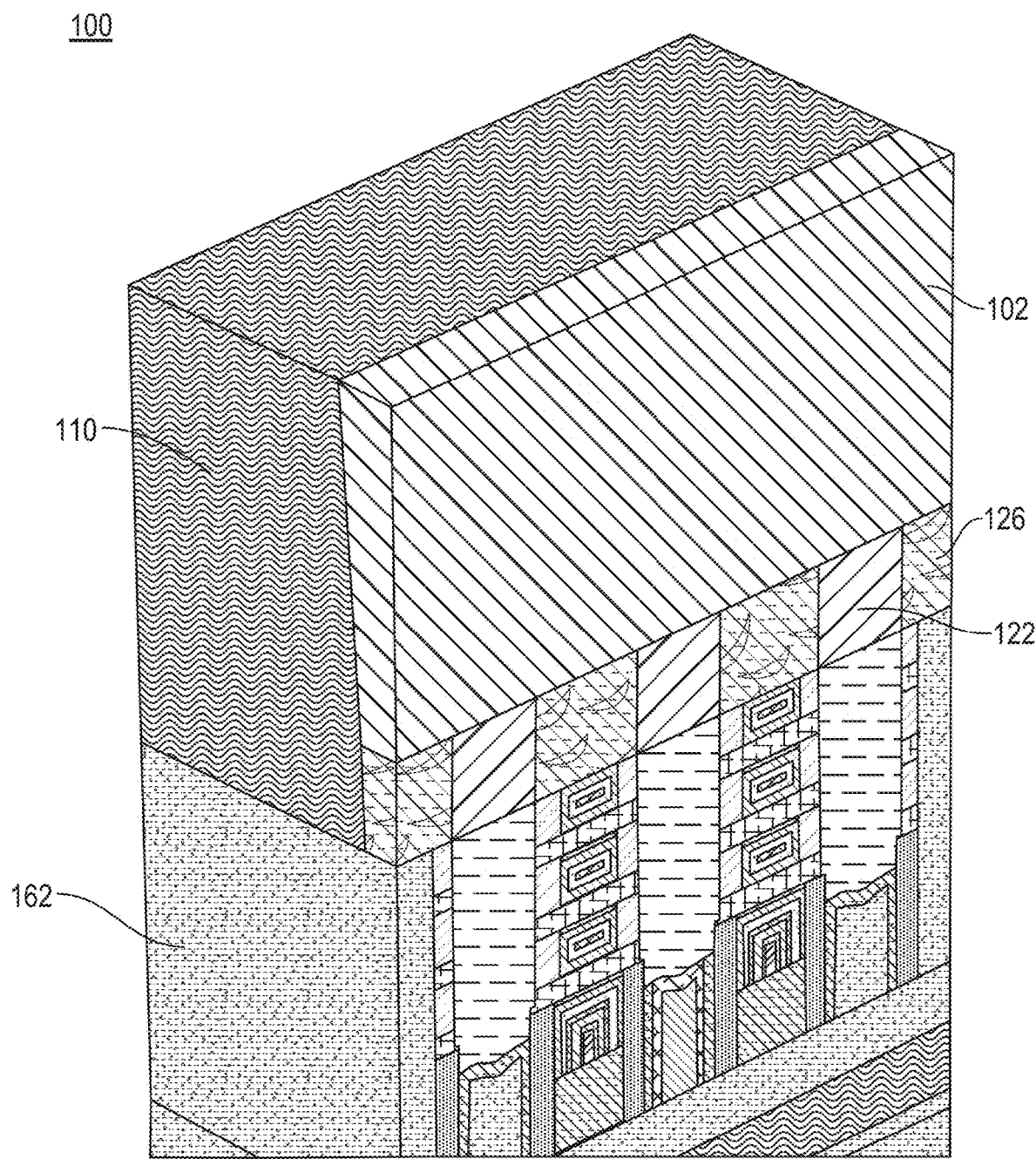

With reference to FIG. 2P, at operation 42 of FIG. 1, the device 100 is rotated or flipped 180 degrees, such that the substrate 102 is now at the top of the illustration. In one or more embodiments, the device 100 is then planarized. The planarization may be any suitable planarization process known to the skill artisan including, but not limited to, chemical mechanical planarization (CMP). In some embodiments, an advanced chemical mechanical planarization (CMP) process is used for backside wafer polishing to realize a backside power rail. Advanced CMP uses end-point detection (EDP). Precision process control and EPD are required to minimize dishing and erosion in the structure. Traditional CMP does not use end-point detection (EDP).

Figure 2Q:
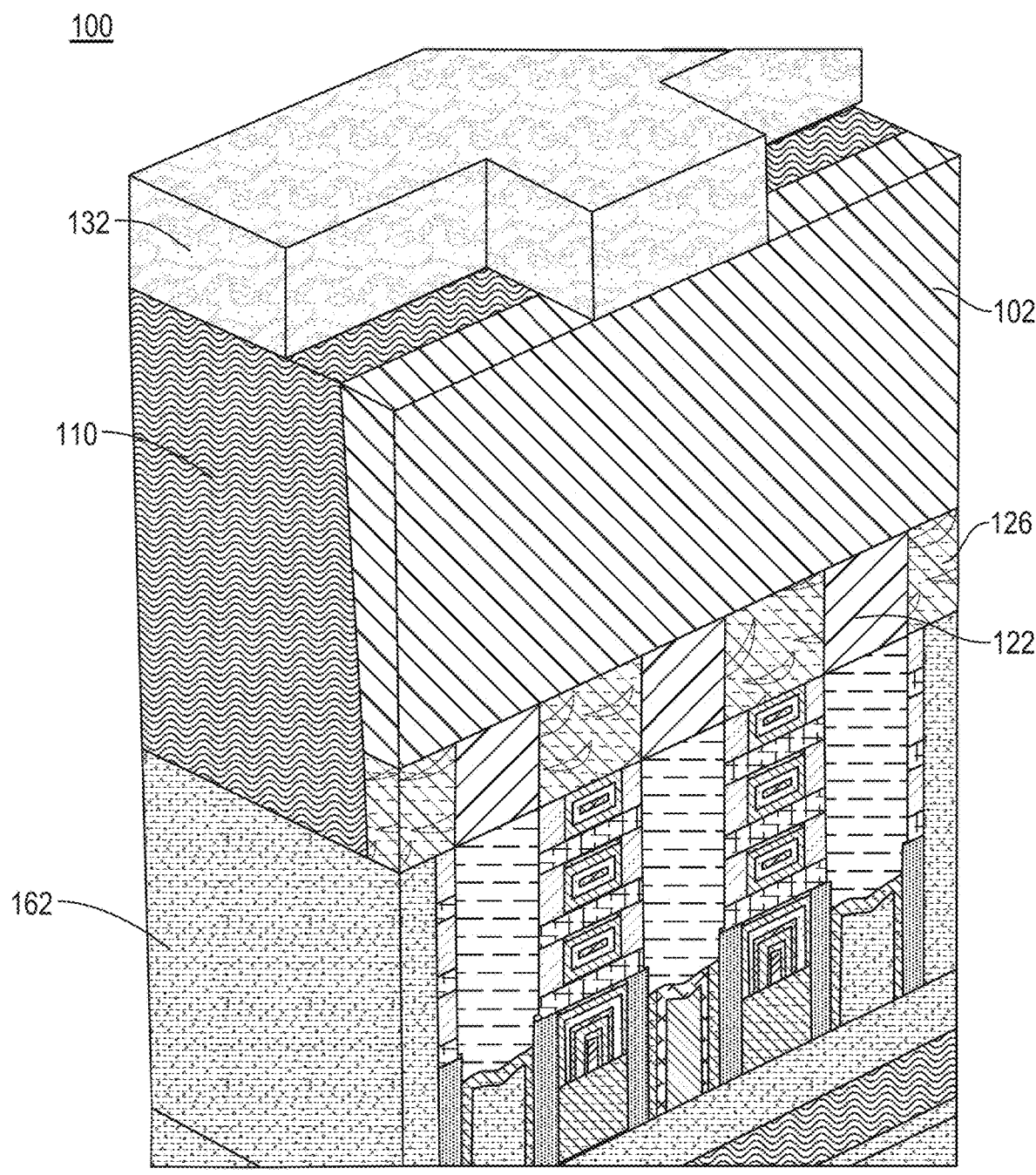

As illustrated in FIG. 2Q, at operation 44 of FIG. 1, in one or more embodiments, a hardmask material 132 is deposited on the backside on the substrate 102 and is patterned. The hardmask material 132 may be deposited by any suitable means known to one of skill in the art. The hardmask material 132 may comprise any suitable material known to the skilled artisan. In one or more embodiments, the hardmask material 132 comprises one or more of silicon nitride (SiN), carbide, or boron carbide, to allow high aspect ratio etch and metallization.

Figure 2R:
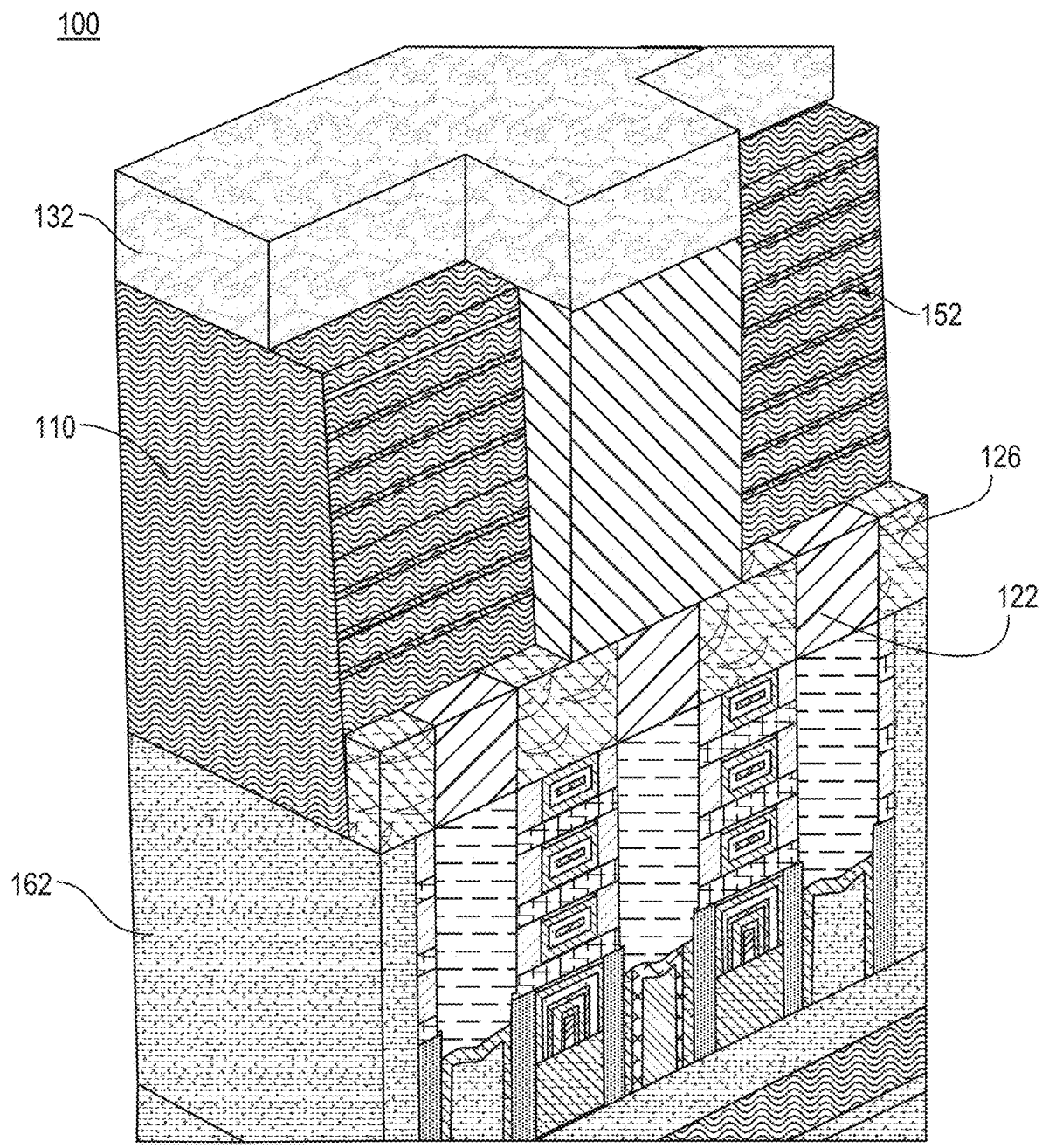

Referring to FIG. 1 and FIG. 2R, in one or more embodiments, at operation 46, the substrate 102 is selectively removed to form the backside via 152. The via 152 may be formed by any suitable means known to the skilled artisan. In one or more embodiments, the via 152 may be formed by patterning and etching the substrate 102 and the STI layer 110. When the via 152 is patterned, it extends from a top surface of the hardmask material 132 to the first bottom dielectric isolation (BDI) layer 122 and the second bottom dielectric isolation (BDI) layer 126. In one or more embodiments, the first bottom dielectric isolation (BDI) layer 122 and the second bottom dielectric isolation (BDI) layer 126, thus, serve as an etch stop layer. In some embodiments, the aspect ratio of the via 152 is greater than or equal to about 5:1, about 10:1, about 15:1, about 20:1, about 25:1, about 30:1, about 35:1 or about 40:1.

Figure 2S:
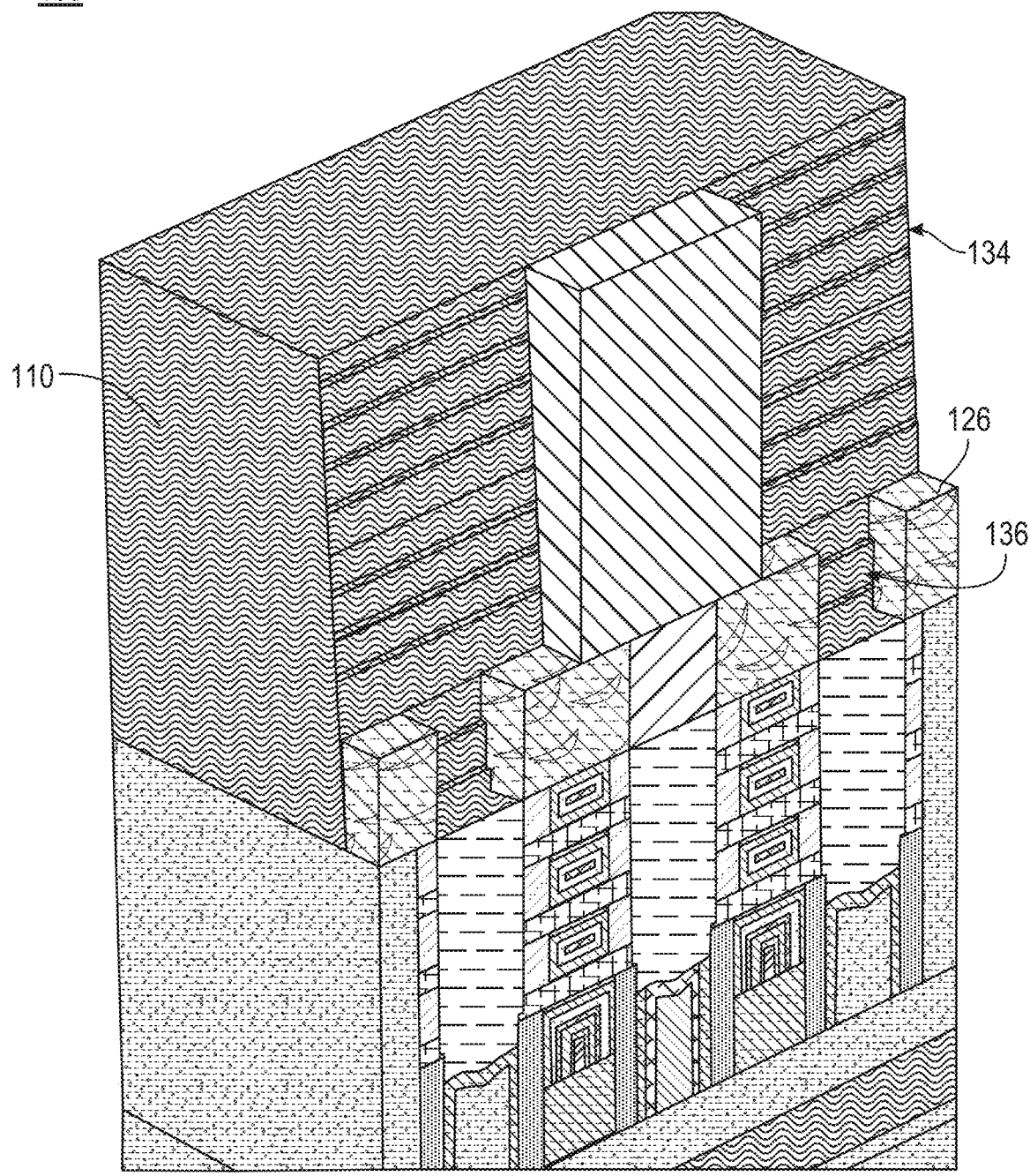
Figure 2T:
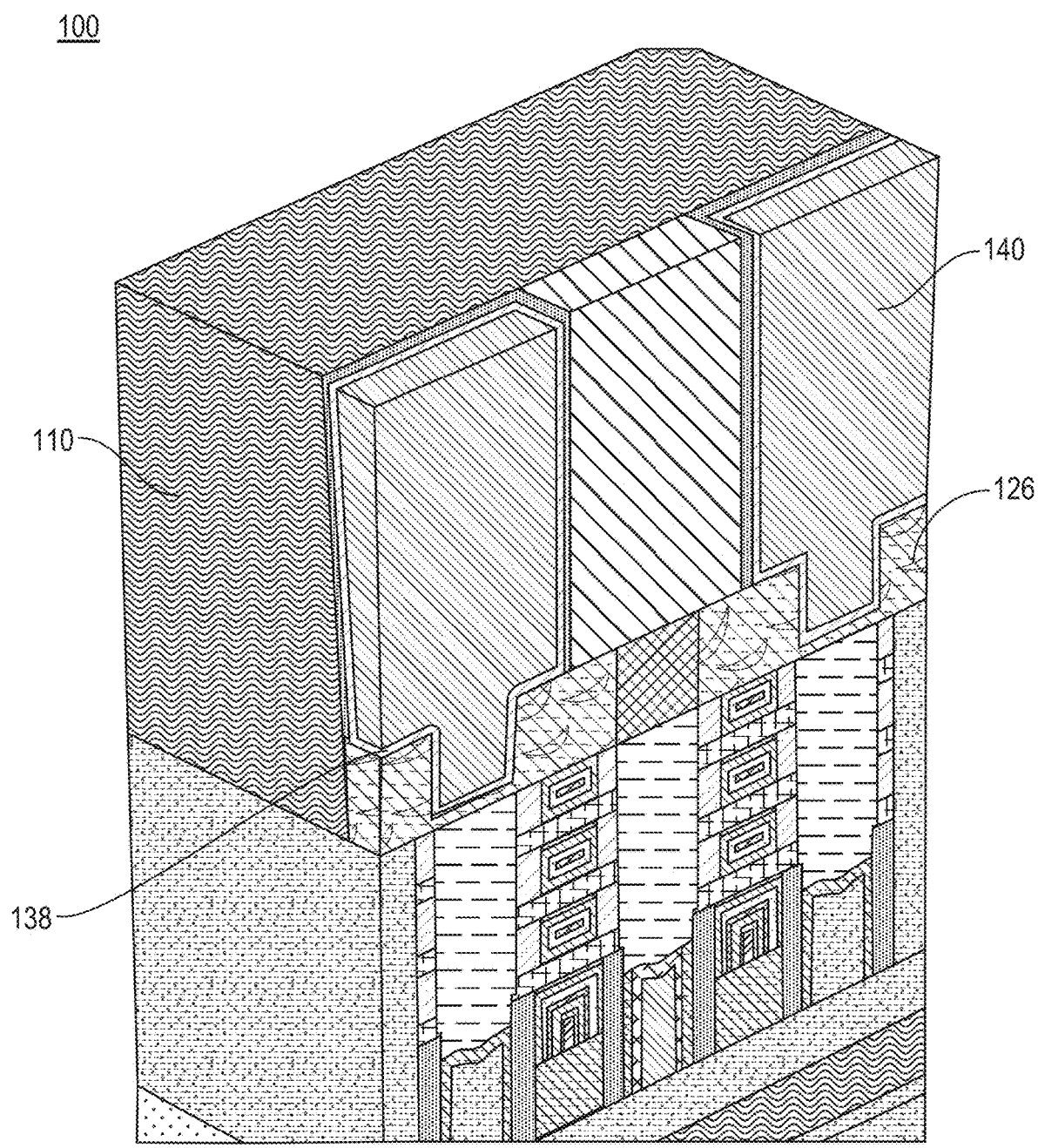

With reference to FIG. 1 and FIG. 2S, at operation 48, the first bottom dielectric isolation (BDI) layer 122 is selectively removed to form an opening 136 at the bottom of the via 152. In one or more embodiments, the second bottom dielectric isolation (BDI) layer 124 is not removed during the etching. Accordingly, in one or more embodiments, selectively removing the first bottom dielectric isolation (BDI) layer 122 increases the size of the backside power rail (BPR) via 152.

At operation 50 of FIG. 1 as illustrated in FIG. 2T, the device 100 is silicidated and a barrier layer 138 is deposited in the via 152. The barrier layer 138 may comprise any suitable material known to the skilled artisan. In some embodiments, the barrier layer 138 comprises titanium nitride (TiN) or tantalum nitride (TaN). At operation 52, a metal 140 is deposited in the via 152 on the barrier layer 138. The metal 140 may comprise any suitable metal known to the skilled artisan. In one or more embodiments, the metal 140 is selected from one or more of tungsten (W), molybdenum (Mo), cobalt (Co), copper (Cu), ruthenium (Ru), and the like.

With reference to FIG. 1, at operation 54, the backside metal line (M0) is formed. Without intending to be bound by theory, it is thought that locating the power rail on the backside allows for a gain in the area of the cell in a range of from 20% to 30%.

Figure 3:
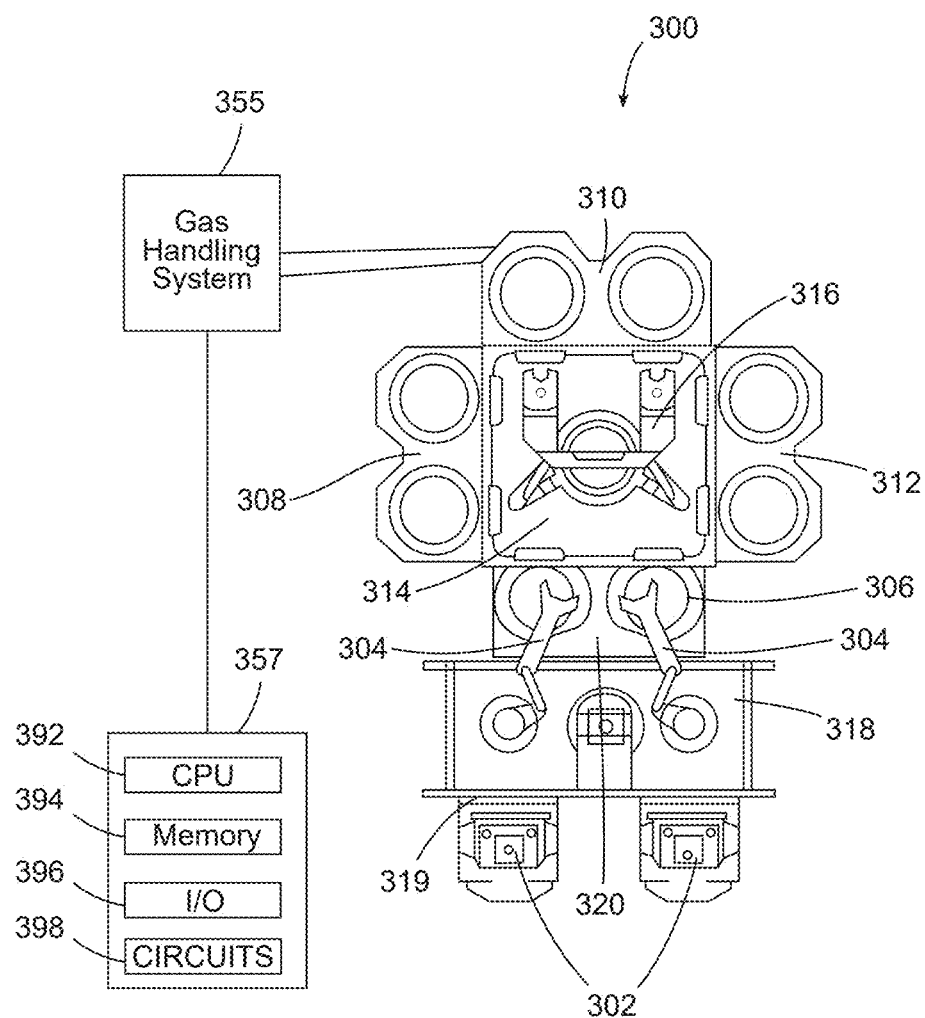
FIG. 3 illustrates a cluster tool according to one or more embodiments.

Additional embodiments of the disclosure are directed to processing tools 300 for the formation of the GAA devices and methods described, as shown in FIG. 3. A variety of multi-processing platforms may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber, an etching chamber, and the like. The particular arrangement of process chambers and components can be varied depending on the cluster tool and should not be taken as limiting the scope of the disclosure.

In the embodiment shown in FIG. 3, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the rapid thermal processing chamber to crystallize the template material.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a template deposition chamber and a template crystallization chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
    forming a gate structure on a superlattice structure, the superlattice structure on a sacrificial layer on a substrate, the superlattice structure comprising a plurality of horizontal channel layers and a corresponding plurality of semiconductor material layers alternatingly arranged in a plurality of stacked pairs;
    forming a source trench and a drain trench adjacent to the superlattice structure, the source trench and the drain trench extending to a top surface of the sacrificial layer;
    etching the sacrificial layer through the source trench and through the drain trench to increase a depth of the source trench and the drain trench;
    depositing a first bottom dielectric isolation layer adjacent to the sacrificial layer in the source trench and the drain trench;
    removing the sacrificial layer to form an opening under the superlattice structure and adjacent to the first bottom dielectric isolation layer;
    depositing a second bottom dielectric isolation layer in the opening under the superlattice structure and adjacent to the first bottom dielectric isolation layer;
    laterally recessing the plurality of semiconductor material layers to form a recessed region;
    forming an inner spacer layer in the recessed region;
    epitaxially forming a source/drain region in the source trench and the drain trench;
    rotating the semiconductor device;
    depositing a hardmask material on the backside of the substrate;
    selectively etching the substrate to form a backside power rail via openings extending to the first bottom dielectric isolation layer and the second bottom dielectric isolation layer;
    selectively removing the first bottom dielectric isolation layer through the backside power rail via opening; and
    depositing a metal in the backside power rail via opening to form a via.

2. The method of claim 1, wherein the first bottom dielectric isolation layer is etch selective to the second bottom dielectric isolation layer.

3. The method of claim 2, wherein the first bottom dielectric isolation layer and the second bottom dielectric isolation layer independently comprises one or more of silicon oxide (SiOx), silicon nitride (SiN), silicon carbide (SiC), boron doped silicon, carbon doped silicon oxynitride (SiOCN), silicon doped boron, metal, metal oxide, metal silicide, metal carbide, and high-κ material.

4. The method of claim 3, wherein the first bottom dielectric isolation layer comprises carbon doped silicon oxynitride (SiOCN) and the second bottom dielectric isolation layer comprises carbon doped silicon oxynitride (SiOCN) having a different composition than the first bottom dielectric isolation layer to provide etch selectivity when compared to the first bottom dielectric isolation layer.

5. The method of claim 1, wherein the plurality of semiconductor material layers comprise silicon germanium (SiGe) and the plurality of horizontal channel layers comprise silicon (Si).

6. The method of claim 1, wherein the plurality of semiconductor material layers comprise silicon (Si) and the plurality of horizontal channel layers comprise silicon germanium (SiGe).

7. The method of claim 1, wherein the gate structure comprises one or more of tungsten (W), cobalt (Co), molybdenum (Mo), ruthenium (Ru), titanium nitride (TiN), tantalum nitride (TaN), titanium aluminum (TiAl), and N doped polysilicon.

8. The method of claim 1, wherein the method is performed in a processing chamber without breaking vacuum.

9. A method of forming a semiconductor device, the method comprising:
   forming a source trench and a drain trench adjacent to a superlattice structure on a sacrificial layer on a substrate, the source trench and the drain trench extending to a top surface of the sacrificial layer, the superlattice structure comprising a plurality of horizontal channel layers and a corresponding plurality of semiconductor material layers alternatingly arranged in a plurality of stacked pairs;
   etching the sacrificial layer through the source trench and through the drain trench to increase a depth of the source trench and the drain trench;
   depositing a first bottom dielectric isolation layer adjacent to the sacrificial layer in the source trench and the drain trench;
   removing the sacrificial layer to form an opening under the superlattice structure and adjacent to the first bottom dielectric isolation layer;
   depositing a second bottom dielectric isolation layer in the opening under the superlattice structure and adjacent to the first bottom dielectric isolation layer;
   selectively etching the substrate to form a backside power rail via opening extending to the first bottom dielectric isolation layer and the second bottom dielectric isolation layer;
   selectively removing the first bottom dielectric isolation layer through the backside power rail via opening; and
   depositing a metal in the backside power rail via opening to form a vias.

10. The method of claim 9, wherein the first bottom dielectric isolation layer is etch selective to the second bottom dielectric isolation layer.

11. The method of claim 10, wherein the first bottom dielectric isolation layer and the second bottom dielectric isolation layer independently comprises one or more of silicon oxide (SiOx), silicon nitride (SiN), silicon carbide (SiC), boron doped silicon, carbon doped silicon oxynitride (SiOCN), silicon doped boron, metal, metal oxide, metal silicide, metal carbide, and high-κ material.

12. The method of claim 11, wherein the first bottom dielectric isolation layer comprises carbon doped silicon oxynitride (SiOCN) and the second bottom dielectric isolation layer comprises carbon doped silicon oxynitride (SiOCN) having a different composition than the first bottom dielectric isolation layer to provide etch selectivity when compared to the first bottom dielectric isolation layer.

13. The method of claim 9, wherein the method is performed in a processing chamber without breaking vacuum.

* * * * *